(12) United States Patent
Ryan et al.

(10) Patent No.: US 6,311,149 B1
(45) Date of Patent: *Oct. 30, 2001

(54) RECONFIGURABLE TEST SYSTEM

(75) Inventors: Arthur Ryan; Hugo Andrade, both of Austin, TX (US)

(73) Assignee: National Instruments Corporation, Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,695

(22) Filed: Jan. 13, 1999

Related U.S. Application Data

(63) Continuation-in-part of application No. 08/912,427, filed on Aug. 18, 1997.
(60) Provisional application No. 60/074,806, filed on Feb. 17, 1998.

(51) Int. Cl.[7] ............... G06F 9/44; G06F 13/10; G06F 13/12; G06F 9/455

(52) U.S. Cl. ............................... 703/21; 703/23

(58) Field of Search ........................ 703/21, 23

(56) References Cited

U.S. PATENT DOCUMENTS

| 4,849,880 | 7/1989 | Bhaskar et al. . |
| 4,901,221 | 2/1990 | Kodosky et al. . |
| 5,109,504 | 4/1992 | Littleton . |

(List continued on next page.)

FOREIGN PATENT DOCUMENTS

| WO 94 10627 A | 5/1994 | (WO) . |
| WO 94 15311 A | 7/1994 | (WO) . |
| WO 96 14618 A | 5/1996 | (WO) . |

OTHER PUBLICATIONS

Fountain: "Software advances in measurement and instrumentation"; IEE Coll. Software Instrumentation; pp. 4/1 to 4/45, 1993.*
Wenban et al.; "A software development system for FPGA–based data acquisition systems"; IEEE Symp. FPGAs for Custom Computing Machines, pp. 28–37, Apr. 1996.*

(List continued on next page.)

*Primary Examiner*—Kevin J. Teska
*Assistant Examiner*—Hugh Jones
(74) *Attorney, Agent, or Firm*—Conley, Rose & Tayon, PC; Jeffrey C. Hood

(57) ABSTRACT

A reconfigurable test system including a host computer coupled to a reconfigurable test instrument. The reconfigurable test instrument includes reconfigurable hardware—i.e. a reconfigurable hardware module with one or more programmable elements such as Field Programmable Gate Arrays for realizing an arbitrary hardware architecture and a reconfigurable front end with programmable transceivers for interfacing with any desired physical medium—and optionally, an embedded processor. A user specifies system features with a software configuration utility which directs a component selector to select a set of software modules and hardware configuration files from a series of libraries. The modules are embedded in a host software driver or downloaded for execution on the embedded CPU. The configuration files are downloaded to the reconfigurable hardware. The entire selection process is performed in real-time and can be changed whenever the user deems necessary. Alternatively, the user may create a graphical program in a graphical programming environment and compile the program into various software modules and configuration files for host execution, embedded processor execution, or programming the reconfigurable hardware.

39 Claims, 11 Drawing Sheets

U.S. PATENT DOCUMENTS

| | | |
|---|---|---|
| 5,437,464 | 8/1995 | Terasima et al. . |
| 5,497,498 | 3/1996 | Taylor . |
| 5,535,342 | 7/1996 | Taylor . |
| 5,566,295 | 10/1996 | Cypher et al. . |
| 5,583,749 | 12/1996 | Tredennick et al. . |
| 5,603,043 | 2/1997 | Taylor et al. . |
| 5,652,875 | 7/1997 | Taylor . |
| 5,684,980 | 11/1997 | Casselman . |
| 5,784,275 | 7/1998 | Sojoodi et al. . |
| 5,847,955 * | 12/1998 | Mitchell et al. ............... 700/86 |

OTHER PUBLICATIONS

XP000554820 Edwards, et al., "Software acceleration using programmable hardware devices," IEEE Proceedings: Computers and Digital Techniques, vol. 143, No. 1, Jan. 1996, pp. 55–63.

XP000380758 Lesser, et al., "High Level Synthesis and Generating FPGAs with the BEDROC System," Journal of VLSI Signal Processing, vol. 6, No. 2, Aug. 1993, pp. 191–214.

International Search Report for PCT/US 98/13040 mailed Dec. 22, 1998.

Douglas, Bruce D., Ph.D., Custom Embedded Communication Protocols, Conference Proceedings of Embedded Systems Conference East, Mar. 10–12, 1997, Boston, Massachusetts, pp. 637–657.

Labrosse, Jean, "Inside Real–Time Kernels," Conference Proceedings of Embedded Systems Conference East, Mar. 10–12, 1997, Boston Massachusetts, pp. 205–214.

Labrosse, Jeam. "Designing with Real–Time Kernels," Conference Proceedings of Embedded Systems Conference East, Mar. 10–12, 1997, Boston, Massachusetts, pp. 379–389.

Operating Systems, $2^{nd}$ Ed. By Williams Stallings, Prentice Hall, 1995, "Multiprocessor and Real–Time Scheduling", pp. 394–415.

International Search Report for PCT/US 98/10916 dated Sep. 17, 1998.

"Lab View User Manual for Windows", National Instruments Co., pp. 4/1–21.

Beguelin et al., "Visualization and Debugging in a Heterogenous Environment," IEEE, pp. 88–95.

Jamal et al., "The Applicability of the Visual Programming Language LabView to Large Real–World Application," IEEE, pp. 99–106.

Per–Arne Wiberg, "Graphical Programming of Time–Deterministic Real–Time Systems," IEEE, pp. 173–180.

XP0002087124 Xiao–Yu, et al., "Software Environment for WASMII: A Data Driven Machine with a Virtual Harware," Field Programmable Logic Architectures, Synthesis and Applications, $4^{th}$ International Workshop on Field–Programmable Logic and Applications, FPL '94 Proceedings, Berlin Germany, 1994.

* cited by examiner

Host Software Architecture

Programmable Trigger Circuit

RECONFIGURABLE TEST SYSTEM

PRIORITY DATA

This application claims benefit of priority of provisional application Ser. No. 60/074,806 entitled "Dynamic Hardware and Software Reconfiguration for Telecommunication Testing" filed Feb. 17, 1998, whose inventors are Arthur Ryan and Hugo Andrade.

This application is a continuation-in-part of U.S. patent application Ser. No. 08/912,427 filed Aug. 18, 1997, entitled "System and Method for Converting Graphical Programs into Hardware Implementations" whose inventors are Jeffrey L. Kodosky, Hugo Andrade, Brian Keith Odom and Cary Paul Butler.

FIELD OF THE INVENTION

The present invention relates to the field of test and measurement, and in particular, to a test system which provides reconfigurable testing of a wide variety of test devices.

DESCRIPTION OF THE RELATED ART

Product testing is in many ways essential to the successful development of new products and the refinement of existing products. The type of testing applied to a product is likely to evolve as the product itself matures from an initial prototype to a marketable system. For a product which is ready for mass production, it is quite typical for the product manufacturer to design dedicated test instruments for testing the product and/or its subsystems. A test instrument often includes dedicated hardware which is especially adapted for the target unit under test or UUT (i.e., the device which is to be tested) and/or for the specific series of test procedures to be applied to the target UUT. Such a test instrument is generally useless for testing devices apart from the target UUT (or set of UUTs) for which it was designed. Furthermore, a test instrument typically looses it utility when its target UUT is modified, or when the test procedures to be applied to the target UUT require alteration. The costs associated with redesigning the test instrument for the modified target UUT or for the updated test procedures contributes significantly to the overall cost of the product.

The telecommunication industry is a prime example of an industry which suffers from the rapid obsolescence of test systems. The telecommunication industry has expanded rapidly in response to improvements in device technologies and escalating public demand for telecommunication services. This expansion can be measured by the number of new telecommunication products/devices marketed each year. In order to test and validate a telecommunication device, manufacturers may rely on a test system which has been custom designed for the telecommunication device.

Consider the example of cellular phone technology. Cellular phones are quite typically designed with an RF transceiver card and a controller card which communicate with one another via a serial bus. One prior art solution for testing cellular phones involves the use of a specialized hardware test board. The hardware test board couples to a card which is to be tested, and emulates the complementary card. The hardware test board is typically connected to a host computer. A software program running on the host computer controls and monitors a test procedure which is implemented by the hardware test board. Because the hardware test board typically includes dedicated hardware adapted for communicating with the card under test, its utility may come to an end when the card under test is modified. The time required to redesign a hardware test board is a burden on the development cycle of new products, and contributes significantly to the end cost of these products.

Thus, there exists a substantial need for a test system with reconfigurable hardware which could rapidly and inexpensively adapt to changes in a target UUT, or changes in the test procedures to be applied to the target UUT. Similarly, there exists a significant need for a test system with reconfigurable hardware which could be rapidly and inexpensively modified to support any desired target UUT and any desired set of test procedures.

Another problem inherent in telecommunication testing is the proliferation of telecommunication protocols. Manufacturers of test systems attempt to provide support for any existing telecommunication protocols that are likely to be of interest to their customers. Because test systems quite often commit the details of protocol handling to dedicated hardware, test systems quickly become useless or obsolete when new protocols emerge. In addition, telecommunication companies utilize many internal communication standards which are proprietary. Such companies may be forced to design their own test system for testing products conforming to the internal standards. Thus, there is a profound need for a test system with reconfigurable hardware which may be rapidly configured to handle any desired communication protocol.

SUMMARY OF THE INVENTION

The problems outlined above are largely resolved by the reconfigurable test system and method of the present invention. The reconfigurable test system includes a host computer coupled to a reconfigurable test instrument (RTI). The RTI is configured for coupling to a unit under test through a communication medium. The RTI preferably includes a reconfigurable hardware module, a reconfigurable front end, and optionally an embedded processor with local memory. The reconfigurable hardware module preferably includes one or more reconfigurable or programmable hardware devices such as Field Programmable Gate Arrays (FPGAs). Thus, the reconfigurable hardware module may be programmed to realize any desired hardware architecture. The reconfigurable front end preferably includes programmable transceivers which may be programmed to interface with any desired types of signals using any desired line encoding scheme, voltage levels, etc. If an embedded processor is present on the RTI, an additional measure of programmability is afforded by appropriate selection of the embedded instruction code to be executed by the embedded processor.

Because of the combination of reconfigurable technologies incorporated in the RTI, the RTI may be programmed to operate with any desired type of UUT, any desired communication medium, any desired protocol(s) for signal exchange over the communication medium, and any desired test procedure, etc. Furthermore, these reconfigurable technologies also allow the RTI to be rapidly reprogrammed or updated in response to changes in the UUT, changes in the communication medium, changes in the protocol(s) used for signal exchange over the communication medium, changes in the desired test procedure, etc.

A user may specify a set of desired operational characteristics for the reconfigurable test system utilizing a software configuration utility running on the host computer. The software configuration utility presents the user with a variety of choices of operational features such as, for example: a desired number of communication channels to be programmed into the RTI for signal exchange with the UUT; a desired directionality (input/output) for each of the communication channels; telecommunication protocols to be used for each of the communication channels; a line encoding scheme for receiving or transmitting signals from/to the UUT on each communication channel; voltages levels to be used for multi-level signal reception or transmission on each of the channels; synchronous versus asynchronous transfer; etc. In response to the user selections, a component selector program selects a hardware architecture file from a hardware architecture library, a front-end configuration file from a front-end configuration library, a number of host driver modules from a host software library, and optionally one or more embedded software programs from an embedded code library. The libraries include files for any possible combination of user choices. The hardware architecture file is downloaded to the reconfigurable hardware module on the RTI. The front end configuration file is downloaded to the reconfigurable front end on the RTI. The host driver modules are registered with a host software driver. The one or more embedded software programs are downloaded to embedded memory for execution by a local processor on the RTI. The downloaded files and registered modules posits or configures the reconfigurable test system with the operational attributes selected by the user with the configuration utility. A software test application executing on the host computer controls and monitors the reconfigurable test system 100 by making calls to the software driver.

Alternatively, a user may create a graphical program in a graphical programming environment which allows the user to select, manipulate, and interconnect graphical icons. The graphical icons represent a variety of processing operations, functions, and/or transformations which may be of interest to the user such as signal processing blocks, standard software operations, hardware devices, circuits, elements, etc. The user thus builds a graphical program which represents a desired test system architecture. Various portions of the graphical program may then be compiled into one or more of (1) software for execution on the host processor, (2) software for execution on the embedded processor in the RTI, (3) configuration information to be downloaded to the reconfigurable hardware of the RTI, i.e. the reconfigurable hardware module, and/or the reconfigurable front end.

BRIEF DESCRIPTION OF THE DRAWINGS

A better understanding of the present invention can be obtained when the following detailed description of the preferred embodiment is considered in conjunction with the following drawings, in which.

Figure 1:
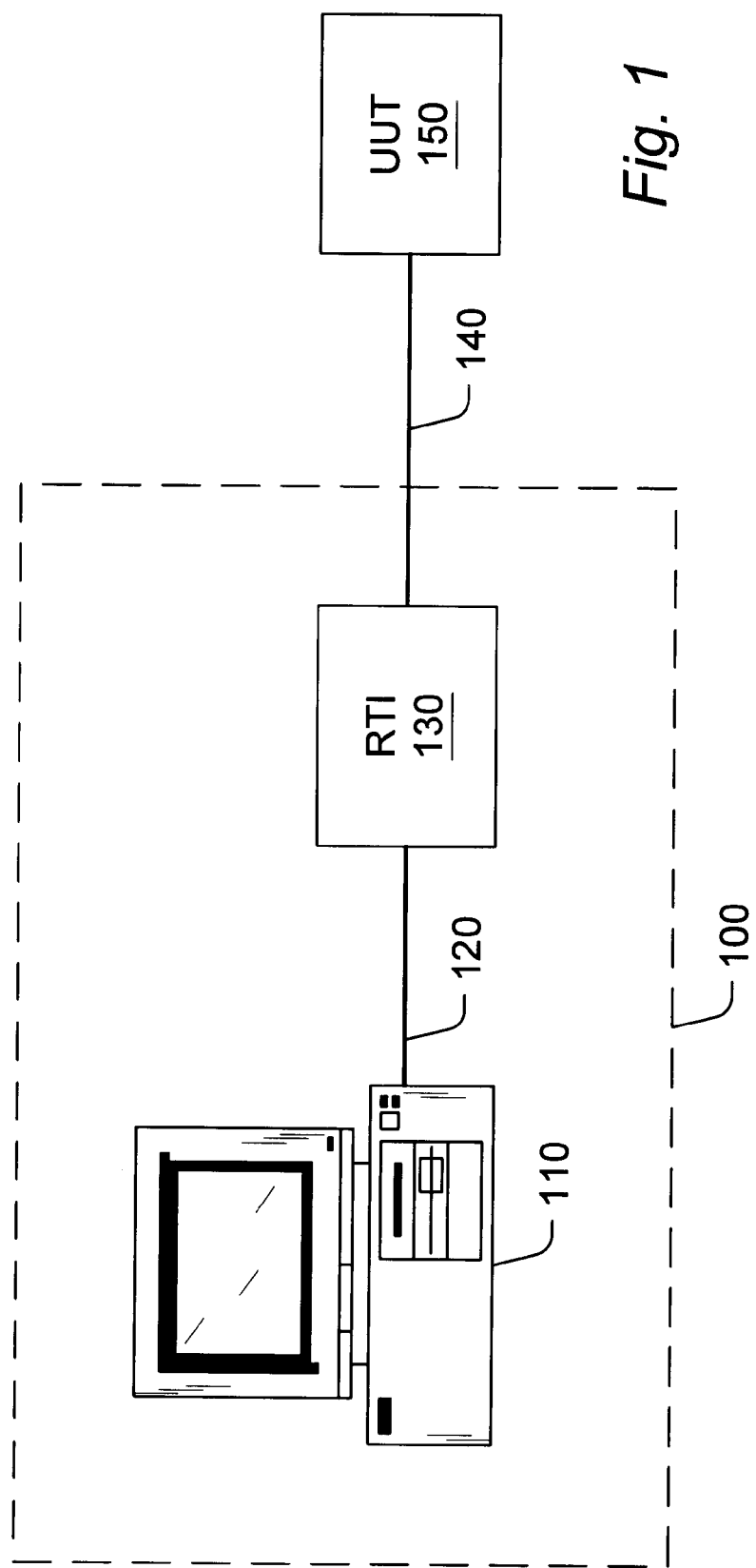
FIG. 1 illustrates a reconfigurable test system 100 according to the present invention.

While the invention is susceptible to various modifications and alternative forms, specific embodiments are shown by way of example in the drawings and will herein be described in detail. It should be understood however, that drawings and detailed descriptions thereto are not intended to limit the invention to the particular forms disclosed. But on the contrary the invention is to cover all modifications, equivalents and alternatives following within the spirit and scope of the present invention as defined by the appended claims.

DETAILED DESCRIPTION OF THE PRESENT INVENTION

Incorporation by Reference

U.S. patent application Ser. No. 08/912,427 filed Aug. 18, 1997, entitled "System and Method for Converting Graphical Programs into Hardware Implementations" whose inventors are Jeffrey L. Kodosky, Hugo Andrade, Brian Keith Odom and Cary Paul Butler, is hereby incorporated by reference in its entirety as though fully and completely set forth herein.

U.S. patent application Ser. No. 08/912,445 filed Aug. 18, 1997, entitled "Embedded Graphical Programming System" whose inventors are Jeffrey L. Kodosky, Darshan Shah, Samson DeKey and Steve Rogers, is hereby incorporated by reference in its entirety as though fully and completely set forth herein.

FIG. 1: Reconfigurable Test System

FIG. 1 illustrates a reconfigurable test system 100 according to the preferred embodiment of the present invention. The reconfigurable test system and method of the present invention may be programmed to suit any desired test and/or measurement application. For example, the reconfigurable test system 100 may be configured for controlling a thermal stress test for manufactured components. In this case, the reconfigurable test system may be coupled to thermal sensors and actuators in order to implement a thermal loading test procedure. The same reconfigurable test system 100 may be later reconfigured for performing vibration testing of some other manufactured device. In this case, the reconfigurable test system may be coupled to appropriate vibration generators and sensors in order to realize a vibration test procedure. These examples illustrate a small subset of the wide variety of test and/or measurement domains in which the reconfigurable test system and method of the present invention may be applicable.

In the preferred embodiment, the reconfigurable test system and method are used for telecommunication test applications, and this embodiment is discussed below. However, the present invention is not intended to be limited to telecommunication test applications, but can be used for any of various test and/or measurement applications as alluded to above. Thus, the following description describes the present invention in the specific domain of telecommunication testing.

As shown in FIG. 1, the reconfigurable test system 100 includes a host computer 110 coupled to a reconfigurable test instrument (RTI) 130 through an interconnecting bus 120. The term "RTI" or "instrument" is intended to include any of various types of devices such as a computer add-in card, an internal computer device, e.g., comprised on the computer motherboard, or an external device, among other configurations.

The RTI 130 is configured for coupling to a unit under test (UUT) 150 through a communication medium 140. It is noted that unit under test 150 may comprise a plurality of separate entities being tested. Also, the communication medium 140 may represent a plurality of distinct communication media. The RTI 130 preferably includes a reconfigurable hardware module, a reconfigurable front end, and optionally an embedded (i.e. local) processor with local memory as shown, e.g., in FIGS. 3A–3B. Thus, the RTI 130 may be programmed to suit any desired test application.

The reconfigurable hardware module preferably includes one or more reconfigurable hardware devices such as Field Programmable Gate Arrays (FPGAs). Thus, the reconfigurable hardware module may be programmed to realize any desired hardware architecture. The reconfigurable front end may be programmed to interface with any desired types of signals using any desired line encoding scheme, voltage levels, etc. If an embedded processor is present on the RTI 130, an additional measure of programmability is afforded by appropriate selection of the embedded instruction code to be executed by the embedded processor.

Because of the combination of reconfigurable technologies incorporated in the RTI 130, the RTI may be programmed to operate with any desired type of UUT 150, any desired communication medium 140, any desired protocol(s) for signal exchange over the communication medium 140, and any desired test procedure, etc. Furthermore, these reconfigurable technologies also allow the RTI 130 to be rapidly reprogrammed in response to changes in the UUT 150, changes in the communication medium 140, changes in the protocol(s) used for signal exchange over the communication medium, changes in the desired test procedure, etc.

The host computer 110 is representative of any of a variety of computing devices such as personal computers, desktop computers, workstations, portable computers, laptop computers, etc. In the preferred embodiment, the RTI 130 is configured as an internal add-in board for insertion into a slot of the host computer 110. Alternatively, the RTI 130 may reside external to host computer 110, or may involve a combination of internal and external parts. In one embodiment, the RTI 130 is situated at a location which is remote from host computer 110. For example, the RTI 130 may be located at a remote test site close to UUT 150 which may be hazardous or otherwise unsuitable for host computer 110.

The interconnecting bus 120 may be realized by any of various bus connectivity technologies such as, e.g., a Peripheral Component Interconnect (PCI) bus, a PXI bus, a Universal Serial Bus (USB), an IEEE 394 bus, etc., or any combination thereof.

The communication medium 140 is representative of any of a variety of physical media including, e.g., metallic wire/cable, optical fiber, the atmosphere, etc., or any combination thereof The RTI 130 may include connectors such as screw terminals or spring loaded terminals for coupling to wires. The RTI 130 may include connectors for one or more types of conductive cable or optical fiber. In addition, the RTI 130 may include connectors for coupling to one or more external antennas for atmospheric transmission or reception of signals. Various embodiments of the RTI 130 are contemplated with varying numbers of connectors and varying combinations of connector types.

The unit under test (UUT) 150 represents one or more devices, systems, components, or combination thereof which are to be tested. UUT 150 interacts with the RTI 130 through the communication medium 140. UUT 150 may be a digital, analog, or a hybrid analog-digital device. In order to communicate with the RTI 130, the UUT 150 may utilize any of a wide variety of communication protocols including proprietary internal protocols. The reconfigurable test system 100 of the present invention may be rapidly programmed, reprogrammed or reconfigured to operate with any desired protocol.

Figure 5:
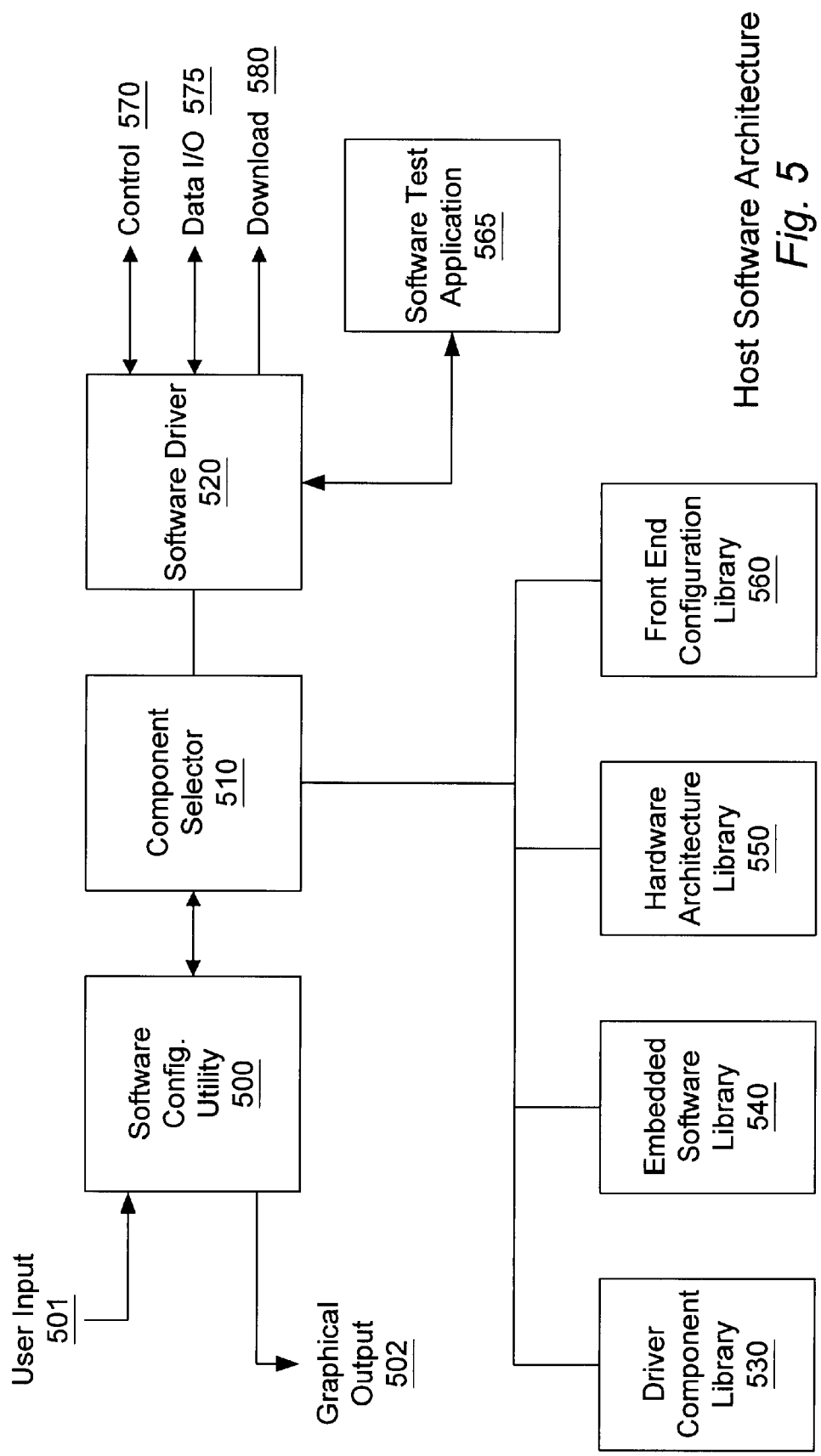
FIG. 5 presents a block diagram of the host software architecture according to the present invention.

Referring ahead briefly to FIG. 5, by means of a software configuration utility 500 running on the host computer 110, a user may specify a set of desired operational characteristics for the reconfigurable test system 100. The software configuration utility 500 preferably includes a graphical user interface which presents the user with a variety of choices such as, for example:

(1) a desired number of serial channels to be programmed into the RTI 130 for signal exchange with the UUT 150;

(2) a desired directionality (input/output) for each of the serial channels;

(3) telecommunication protocols to be used for each of the serial channels;

(3) a line encoding scheme to be used for driving each output channel, and voltage levels for driving multi-level output signals;

(4) a line encoding scheme to be expected for receiving signals on each input channel, and voltage levels to be expected for receiving signals on each input channel;

(5) an option for using synchronous data transfer versus asynchronous data transfer for each serial channel;

(6) for each synchronous channel, a choice of whether an internally generated clock signal is to be used or an externally provided clock;

(7) a choice of test scenario or test procedure which is to be applied to the UUT 150.

In response to the user selections, a component selector 510 accesses one or more libraries 530, 540, 550 and/or 560, and selects from the libraries a collection of files which match the user's selections. The component selector 510 selects a hardware architecture file from a hardware architecture library 550, a front-end configuration file from a front-end configuration library 560, a number of host driver modules from a host software library 530, and optionally one or more embedded software programs from an embedded code library 540. The libraries include files for any possible combination of user choices. The hardware architecture file is downloaded to the reconfigurable hardware module 325 (FIGS. 3A–3B) on the RTI 130. The front end configuration file is downloaded to the reconfigurable front end 330 (FIGS. 3A–3B) on the RTI 130. The host driver modules are registered with a host software driver 520. The one or more embedded software programs are downloaded to embedded memory 310 (FIGS. 3A–3B) for execution by a local processor 305 (FIGS. 3A–3B) on the RTI 130. The downloaded files and/or registered modules posits the reconfigurable test system 100 with the operational attributes selected by the user with the configuration utility 500. A software test application executing on the host computer 110 controls and monitors the reconfigurable test system 100 by making calls to the software driver.

According to the present invention, the RTI 130 is capable of rapid reconfiguration of its operational/functional organization. Whenever the user desires to change some aspect of the reconfigurable test system 100, he/she may invoke the software configuration utility and reprogram the reconfigurable test system 100.

Figure 2:
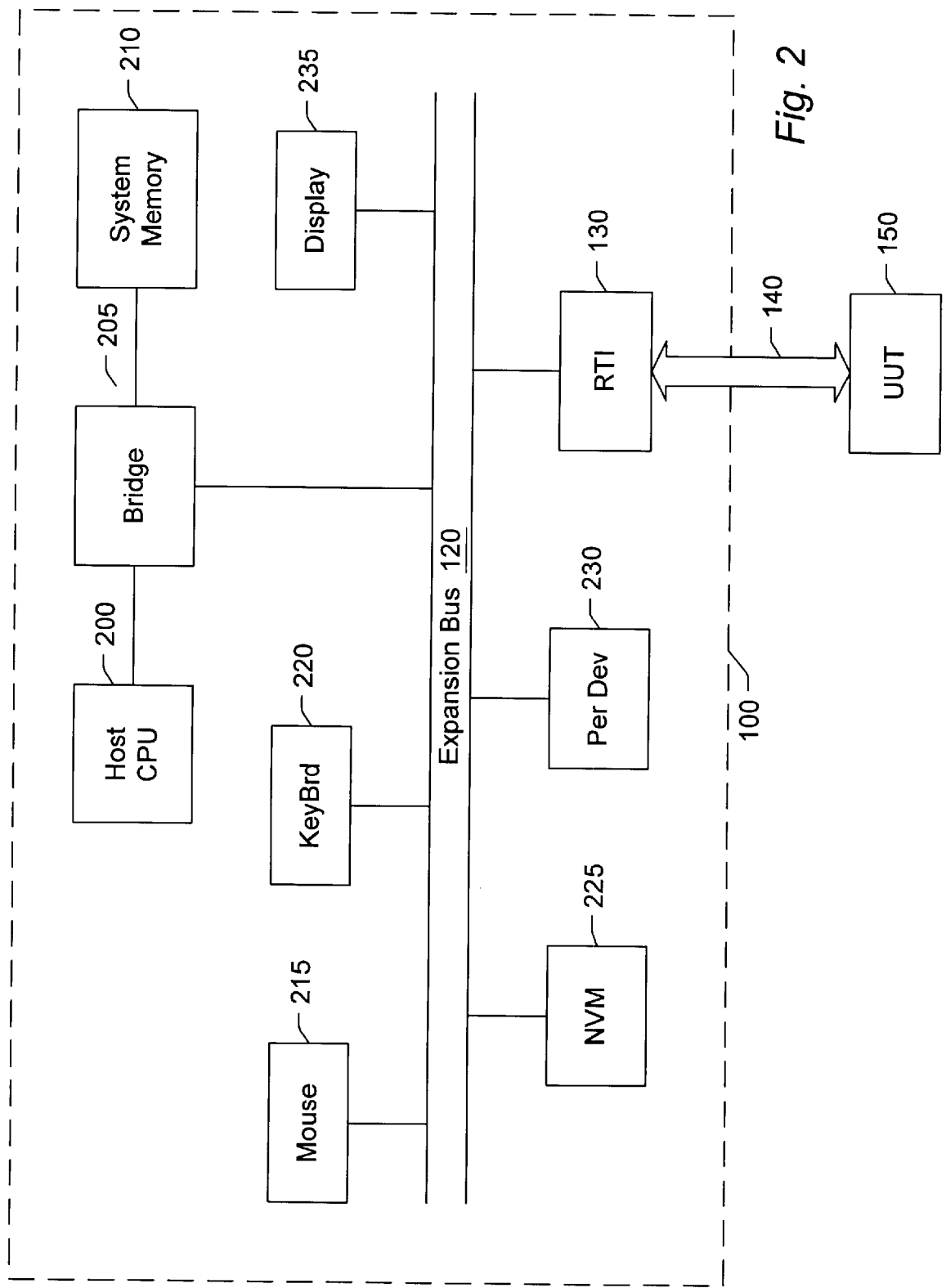
FIG. 2 presents details of one embodiment of the host computer architecture.

FIG. 2: The Host Computer Architecture

FIG. 2 provides one embodiment for the architecture of host computer 110. It is noted that the host computer 110 may have any of various system architectures as desired. Host computer 110 includes a host CPU 200, system memory 210, bus bridge 205, expansion bus 120, input devices such as mouse 215 and keyboard 220, a non-volatile memory 225, a display 235 and reconfigurable test instrument (RTI) 130 according to the present invention. Host computer 110 may also include one or more peripheral devices represented by peripheral device 230.

Bus bridge 205 is coupled to host CPU 200, system memory 210, and expansion bus 120. Bus bridge 205 mediates the high speed transfer of digital data between any two of the host CPU 200, system memory 210 and expansion bus 120. The input devices, non-volatile memory 225 and peripheral device 230 are preferably coupled to the expansion bus 120. Non-volatile memory 225 is representative of a variety of a variety of storage devices such as, e.g., disk drives, CD-ROM drives, zip drives, magnetic tape drives, optical storage, etc., or any combination thereof.

In the preferred embodiment, the RTI 130 is configured for coupling to the expansion bus of host computer 110. Under the control of test software running on host CPU 200 and/or embedded code running on an embedded processor, the RTI 130 executes a test procedure on UUT 150. The RTI sends stimulus signals/patterns to the UUT 150 and receives response signals/patterns from the UUT 150 through the communication medium 140. By analyzing the response signals, the host computer 110 or RTI 130 is able to either validate the UUT 110 or identify defects in the UUT 110.

In the preferred embodiment the expansion bus 120 comprises a Peripheral Component Interconnect (PCI) bus or the PXI (PCI eXtensions for Instrumentation) bus. However, it is noted that the expansion bus 120 may be realized by any of a variety of interconnecting buses or combination thereof. For example, in alternate embodiments the expansion bus 120 comprises an Industry Standard Architecture (ISA) bus or Extended Industry Standard Architecture (EISA) bus.

Non-volatile memory 225 stores one or more software programs according to the present invention which control the operation of host computer 110. These software programs are loaded into system memory 210 prior to execution by host CPU 200.

Figure 3A:
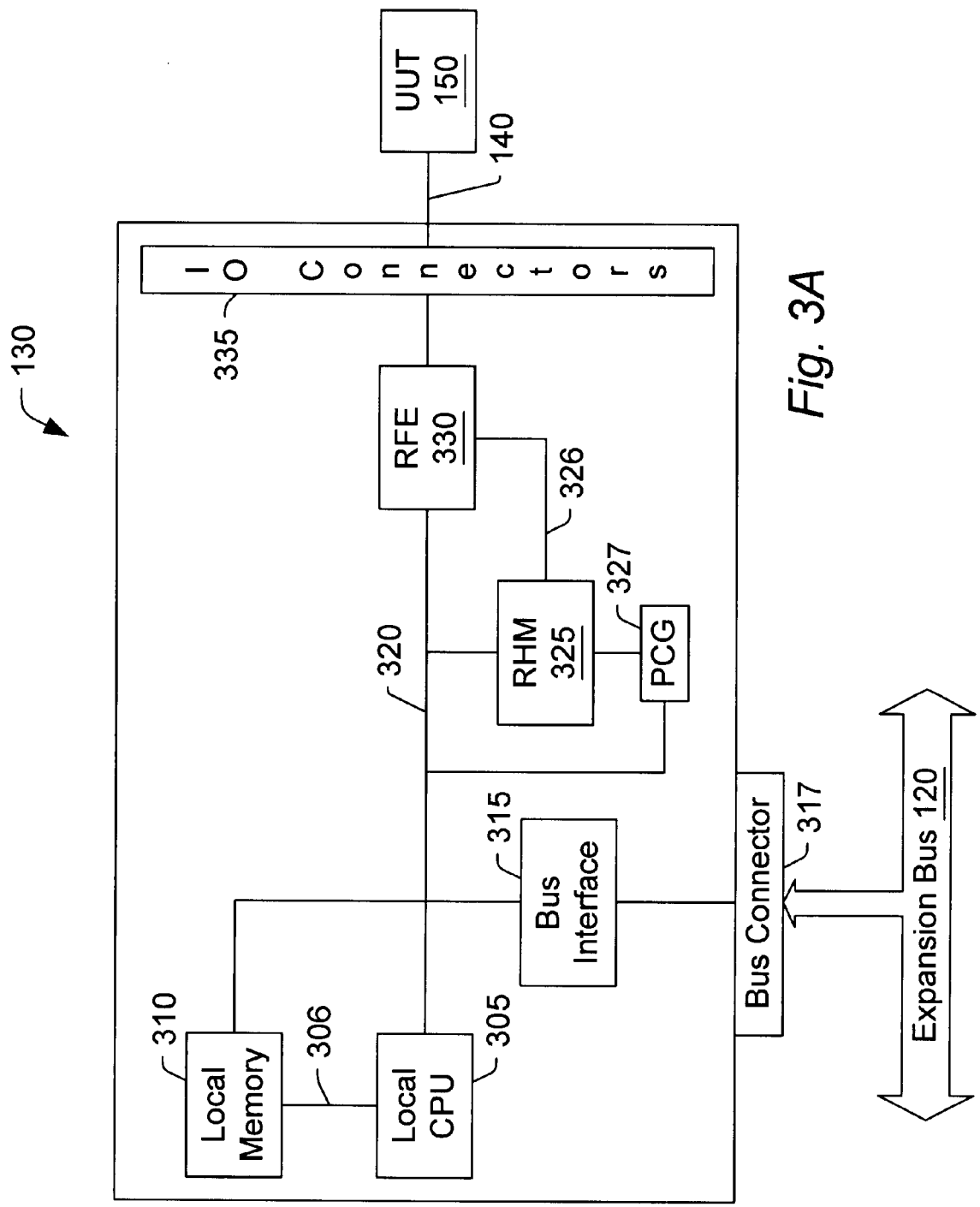
FIG. 3A presents a block diagram of the reconfigurable test instrument according to the preferred embodiment of the present invention.
Figure 3B:
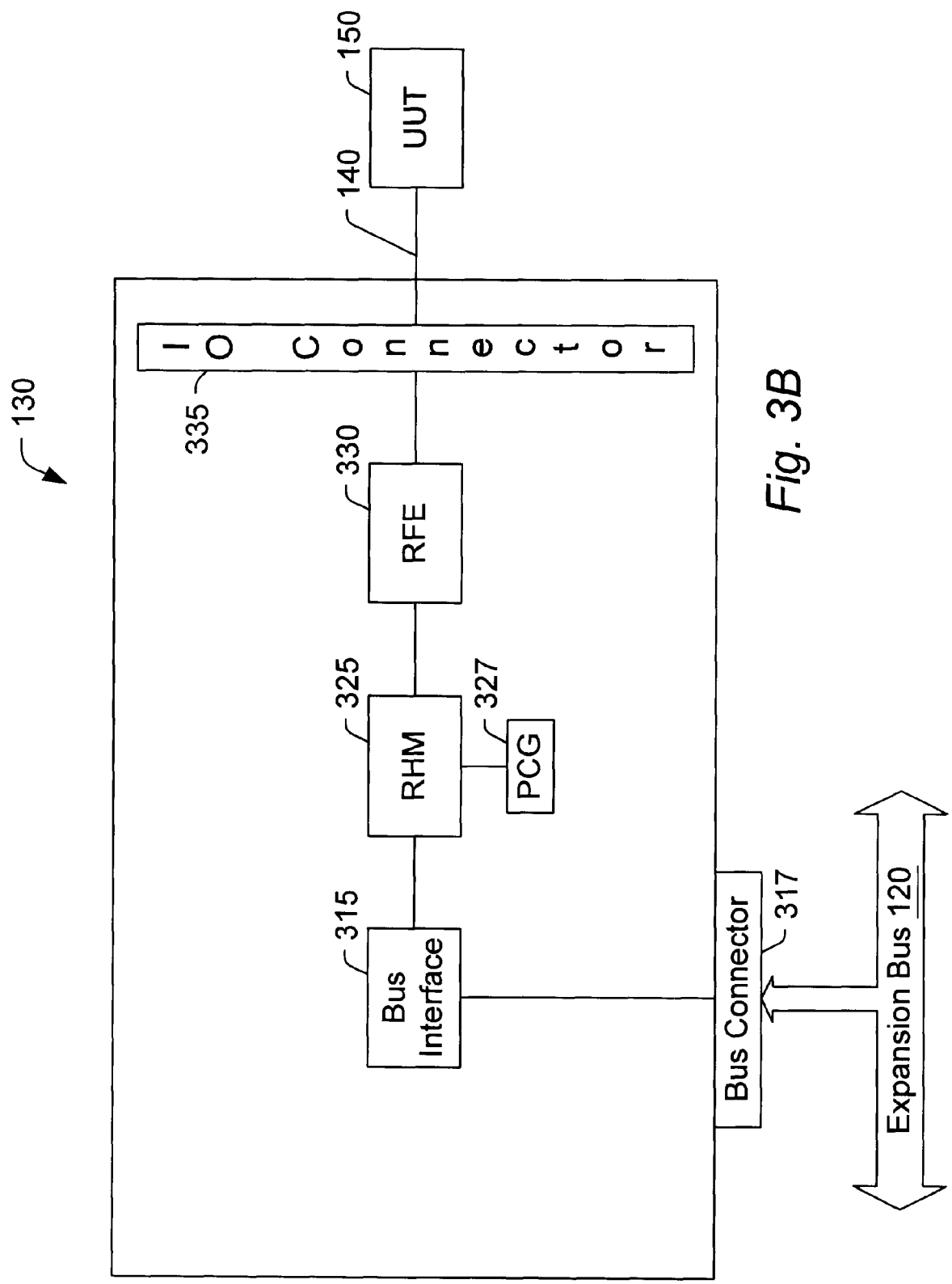
FIG. 3B presents a block diagram of the reconfigurable test instrument according to a second alternate embodiment of the present invention.

The reconfigurable test instrument (RTI) 130 of the present invention may have any of a variety of architectures and forms of which several are illustrated in FIGS. 3A and 3B, and discussed below. While, the RTI 130 is discussed below in terms of telecommunications applications, it should be borne in mind that the RTI 130 may be used for any of various test applications.

FIG. 3A: The Reconfigurable Test Instrument (RTI) 130

FIG. 3A is a block diagram of the reconfigurable test instrument (RTI) 130 according to the preferred embodiment of the present invention. In this embodiment, the RTI 130 includes a reconfigurable hardware module (RHM 325, a reconfigurable front end (RFE) 330 and a local CPU or embedded processor 305. Thus, a user/developer has the freedom to optimize the distribution of processing functions into the RHM 325, RFE 330, embedded program code for execution by local CPU 305, and/or host program code for execution by host CPU 200. Processing functions which require high-speed real-time processing are advantageously performed in reconfigurable hardware, i.e. in RHM 325 and/or RFE 330. Real-time signal processing functions which are algorithmically complex may be performed in embedded software which is executed by the local CPU 305. Non-real-time processing functions such as, e.g., the user interface, background data analysis and visualization may be performed in host software on the host CPU 200.

The RTI 130 includes local memory 310, local (i.e. embedded) CPU 305, bus interface 315, bus connector 317, internal bus 320, reconfigurable hardware module 325, reconfigurable front end (RFE) 330, programmable clock generator 327, and I/O connectors 335. Local memory 310, local CPU 305, bus interface 315, reconfigurable hardware module 325, programmable clock generator 327 and reconfigurable front end 330 couple to internal bus 320. Programmable clock generator (PCG) 327 couples to the reconfigurable hardware module 325. Reconfigurable hardware module may have a dedicated coupling 326 to RFE 330 apart from internal bus 320 in order to facilitate higher speed data transfer. Bus interface 315 couples to bus connector 317.

Local CPU 305 may be directly coupled to local memory 310 through memory bus 306. Thus, local CPU 305 may access local memory 310 even when internal bus 320 is busy with other transfer operations. In addition, RHM 325 may be coupled directly to local memory 310.

Bus connector 317 is configured for coupling to expansion bus 120. I/O connectors 135 represent a collection of connectors for coupling to various kinds of communication media including, e.g., wires, cables, antennas, optical fibers, or any combination thereof. In the preferred embodiment, communication medium 140 represents a plurality of communication channels between the RTI 130 and UUT 150. According to the present invention, the user of reconfigurable test system 100 may configure the RTI 130 and a host software driver (i.e. software driver which is to run on host CPU 200) to operate with any combination of communication protocols for communicating with UUT 150 over the plurality of communication channels.

Bus interface 315 is provided for mediating data transfer between the internal bus 320 and expansion bus 120. Local CPU 305 executes instruction code stored in local memory 310. Local memory 310 comprises Random Access Memory (RAM) and preferably also Read Only Memory (ROM), and stores program variables, data structures, buffers for use by local CPU 305.

Reconfigurable hardware module (RHM) 325 includes one or more programmable devices such as Field Programmable Gate Arrays (FPGAs). Thus, the RHM 325 includes one or more reconfigurable or programmable hardware elements whose interconnectivity and functionality may be programmed by downloading configuration information to the RHM 325. The configuration information posits or configures the RHM 325 with a desired hardware architecture. For this reason, the configuration information downloaded to the RHM 325 is referred to herein as a hardware architecture file. The RHM 325 may be reprogrammed to achieve a new hardware architecture whenever desired.

In the preferred embodiment, as discussed above, the host computer 110 maintains library 550 of hardware architecture files which represent a variety of different hardware architectures. Any of these hardware architecture files may be downloaded to the RHM 325 to achieve corresponding hardware architectures.

In one embodiment, the reconfigurable test system 100 includes a hardware design utility. The hardware design utility provides a graphical user design environment for developing a hardware architecture, and for compiling the hardware architecture into a hardware architecture file. The hardware design utility preferably includes a graphical programming interface in which a user may select and configure graphical icons which represent hardware elements, blocks, subsystems, etc. which are generally referred to as cells. The user graphically specifies the connections between hardware cells as for example by drawing a path between a terminal of one cell to a terminal of another cell using the mouse 215. Examples of selectable hardware elements may include transistors, logic gates, flip-flops, etc, or function blocks such as add blocks, multiply blocks, etc. Examples of selectable hardware blocks may include registers, buffers, parallel-to-serial converters, serial-to-parallel converters, counters, clock frequency dividers, pattern detector circuits, edge detectors, multiplexers, demultiplexers, trigger circuits, shift registers, parity checkers, and arithmetic function circuits. Examples of selectable hardware subsystems may include input channels or output channels. In the preferred embodiment, the hardware design utility is LabVIEW graphical programming software available from National Instruments Corporation. The hardware design utility may use a hardware description language, such as VHDL. The resulting hardware diagram may be compiled to a hardware architecture file. The hardware architecture file may be downloaded to RHM 325 for immediate test system operation, or may be stored in the hardware architecture library 550 for later use.

Programmable clock generator (PCG) 327 generates one or more clock signals which are supplied to RHM 325. The frequencies of the one or more clock signals are programmable. Programming information may be supplied through internal bus 320. Alternatively, PCG 327 may receive programming information from RHM 325. The programmable clock generator 325 preferably includes a numerically controlled oscillator.

Reconfigurable front end (RFE) 330 includes various reconfigurable digital and/or analog circuitry for reconfigurable interfacing of RHM 325 with the communication medium 140. The front-end behavior of the RFE 330 is determined by configuration information supplied to the RFE 330 preferably through internal bus 320. This configuration information is herein referred to as a front end configuration file. RFE 330 mediates the exchange of signals between RHM 325 and UUT 150. RFE 330 receives one or more signals from the UUT 150 transmitted through the communication medium 140 over one or more communication channels. RFE 330 operates on, i.e. decodes, demodulates, conditions, and/or detects these signals in a manner determined by the front-end configuration file. The resultant digital signal(s) are provided to the RHM 325 preferably through dedicated coupling 326. In the reverse direction, RFE 330 receives one or more digital signals supplied by the RHM 325 through the dedicated coupling 326. The RFE 330 operates on, i.e. encodes, modulates, and/or conditions these digital signals in a manner determined by the front end configuration file. The RFE 330 then transmits the resultant signals to the UUT 150 through the communication medium 140 over one or more communication channels which are not necessarily the same as those mentioned above in the receive direction.

Reconfigurable front end (RFE) 330 may be configured for receiving and transmitting any of various kinds of analog, digital, and/or multi-level signals through communication medium 140, and for modulating and/or demodulating these signals according to their respective modalities. A multi-level signal refers to a signal that that may have multiple amplitude levels. A digital signal is a multi-level signal with two amplitude levels. RFE 330 preferably includes one or more programmable transceivers which allow operation with multilevel signals. The number of amplitude levels and the voltages of these amplitude levels are programmable preferably on a per channel basis.

In the preferred embodiment, RFE 330 includes an array of programmable transceivers. Each programmable transceiver forms part of a serial channel as, e.g., serial channel 402-K of FIG. 4B, and admits programming as either a receiver for an input channel or a transmitter for an output channel. The front end configuration file programs RFE 330 and determines such features of the programmable transceivers 410 such as (a) the directionality (input or output) of each programmable transceiver, (b) the line encoding scheme for each programmable transceiver, (c) the modulation or demodulation scheme to be used for each programmable transceiver, etc. As mentioned above, the programmable transceivers 410 may be programmed to transmit or receive multi-level signals to/from the UUT 150. For example, programmable transceiver 410-K (see FIG. 4B) may be programmed as part of a serial output channel to drive conductor 425-K with a multi-level signal. The number of levels and the voltages for each level of the multi-level signal are programmable. Conversely, programmable transceiver 410-K may be programmed as part of a serial input channel to receive from conductor 425-K a multi-level signal. The number of levels to be expected and the nominal voltages for each level of the multilevel signal are programmable.

RFE 330 may include programmable switching circuitry (not shown) for switching analog and/or digital signals between the conductors of I/O connectors 335 and the reconfigurable circuitry of the RFE 330.

RFE 330 may also include one or more A/D converters and D/A converters (not shown) for transmitting analog signals over one or more analog channels. Also RFE 330 may include modulation and demodulation circuitry for transmitting and receiving modulated signals. For example, RFE 330 may include FSK mod/demod circuitry for handling a number of FSK channels. The present invention contemplates the use of any of a variety of modulation schemes, and therefore RFE 330 may include any of a variety of mod/demod circuits.

In one embodiment of reconfigurable test system 100, RFE 330 includes one or more Field Programmable Analog Arrays (FPAAs). An FPAA is an integrated circuit which can be configured to implement various analog functions using a set of configurable analog blocks and a programmable interconnection network. In this embodiment, the front end configuration file includes information for programming the FPAA(s).

In embodiments of the RFE 330 which include FPAA(s), the hardware design utility described above may additionally provide a graphical FPAA design environment for designing an analog circuit diagram, and for compiling the analog circuit diagram into a FPAA definition file. The analog design environment allows the user to select and interconnect graphical icons using, e.g., the mouse 215 of host computer 110. The interconnections may represent conductive paths. The graphical icons represent those analog elements, devices, blocks, or subsystems which are realizable in the FPAA(s). The resultant analog circuit diagram may be compiled into a FPAA definition file, and immediately downloaded to the FPAA(s), or stored in a library of such FPAA definition files for later use.

In yet another embodiment, the hardware design utility includes a graphical front end design environment which allows a user to configure the reconfigurable digital and/or analog hardware of the RFE 330.

It is noted that the digital, analog and front-end design environments provided by the hardware design utility may be integrated into a single design environment. Thus, a user may be able to select both digital cells and analog cells, and interconnect these cells in one circuit diagram subject to any design constraints which may be imposed by the physical hardware, i.e. the RHM 325 and RFE 330. The user may designate the target destination for each cell, block, or subsystem of the combined circuit diagram. Alternatively, the hardware design utility may be delegated the task of optimizing the distribution of cells, blocks, or subsystems between the various target destinations. Target destinations include the RHM 325, the FFPA(s) in the RFE 330, and the remaining hardware in the RFE 330.

Local CPU 305 executes a local control program which is stored in local memory 310. (Local CPU 305 may be variously referred to herein as the embedded CPU, the dedicated CPU, or the on-board CPU. The local control program may be variously referred to herein as the embedded software program or embedded instruction code.) The local control program is downloaded to the local memory 310 by the software configuration utility 500 running on the host CPU 200. Operating under the control of the local control program, local CPU 305 reads out-going data, i.e. data which is to be transmitted to UUT 150, from system memory 210 and/or local memory 310. Local CPU 305 supplies the out-going data to one or more output channels of the RHM 325. The RHM 325 and RFE 330 then transmit the out-going data to UUT 150. Conversely, local CPU 305 reads in-coming data, i.e. data originating from the UUT 150, from one or more input channels of the RHM 325. The in-coming data is then transferred to system memory 210 and/or local memory 310. In addition, the local CPU 305 may perform processing tasks on the in-coming data or out-going data as determined by the local control program.

Therefore, the reconfigurable test instrument (RTI) 130 according to the present invention allows a combination of software programmability by virtue of the local control program and hardware programmability by virtue of the configuration information downloaded to the RHM 325 and RFE 330. The hardware architecture file downloaded to the RHM 325 determines the hardware personality of the RHM 325. Similarly, configuration information downloaded to the RFE 330 determines structure of the RFE 330.

In the embodiment of reconfigurable test instrument 130 shown in FIG. 3A, the presence of a local CPU 305 implies that the reconfigurable test instrument 130 may operate with a measure of independence from host CPU 200. In fact, the reconfigurable test instrument 130 may continue to perform its test control and monitoring functions if the host computer 110 is performing other functions or even if the host computer 110 crashes. Furthermore, reconfigurable test instrument 130 may be provided with its own power supply, and thus may continue to operate even when the host computer 110 loses power.

FIG. 3B: A Second Alternate Embodiment of RTI 130

FIG. 3B presents a second alternate embodiment of the reconfigurable test instrument 130. Many of the blocks comprising this embodiment of the RTI 130 are similar to those already introduced in FIG. 3A and therefore are identically numbered. In this embodiment, the RTI 130 does not include a local CPU. The reconfigurable hardware module (RHM) 325 couples-to bus interface 315, to reconfigurable front end (RFE) 330, and to programmable clock generator (PCG) 327. Bus interface 315 couples to bus connector 317, while bus connector 317 is configured for coupling to expansion bus 120. RFE 330 couples to I/O connectors 335. I/0 connectors 335 (or some subset of I/O connectors 335) couple to the unit under test (UUT) 150 through communication medium 140. In this embodiment, reconfigurable front end 330 may receive its programming information, i.e. the front-end configuration file, through RHM 325.

Figure 4A:
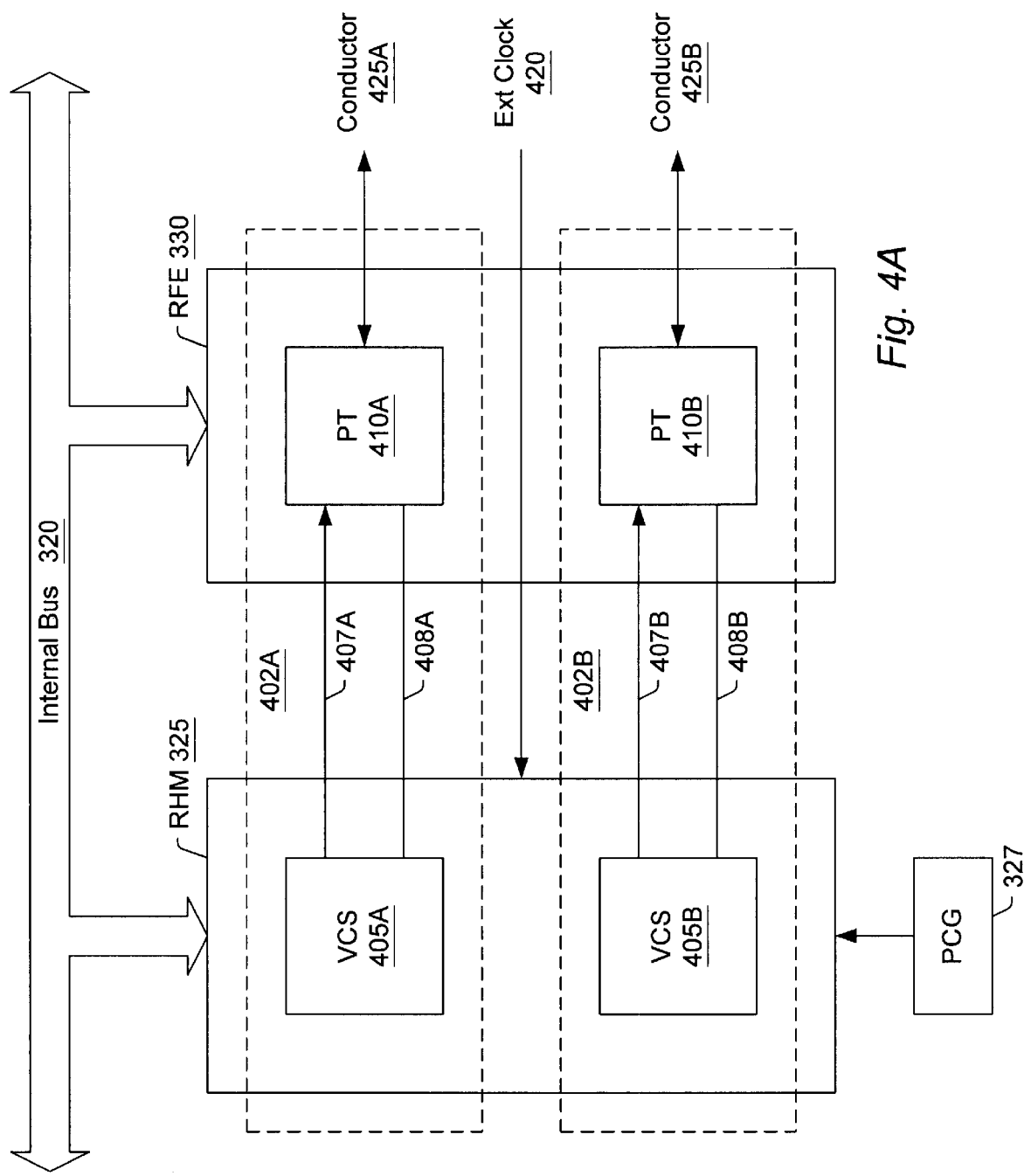
FIG. 4A presents a block diagram of one embodiment of the reconfigurable hardware module 325 and the reconfigurable front end 330 according to the present invention.

FIG. 4A: The Programmable Hardware Module and Reconfigurable Front End

FIG. 4A presents one embodiment of the RHM 325 and RFE 330. In the embodiment of FIG. 4A, RHM 325 and RFE 330 are organized to achieve a pair of serial communication channels 402A and 402B. The behavior of each serial channel is determined by the configuration information downloaded to RHM 325 and RFE 330, i.e., the hardware architecture file and the front end configuration file respectively. While only two serial channels are depicted in FIG. 4A, RHM 325 and RFE 330 may be organized with an arbitrary number of serial channels by a natural extension of the principles herein described. It is noted that the serial channels 402A and 402B will be collectively referred to herein as the serial channels 402.

RHM 325 includes a pair of virtual channel slots, i.e., VCS 405A and VCS 405B. RFE 330 includes a corresponding pair of programmable transceivers, i.e., PT 410A and PT 410B. While only two virtual channel slots and two programmable transceivers are depicted in FIG. 4A, arbitrary numbers of virtual channel slots and programmable transceivers are contemplated. Each serial channel 402 includes a virtual channel slot 405 and a corresponding programmable transceiver 410. For example, serial channel 402A includes virtual channel slot 405A and programmable transceiver 410A. The serial channels 402A and 402B couple to the UUT 150 through conductors 425A and 425B respectively. In the embodiment of FIG. 4A, conductors 425A and 425B form at least a portion of communication medium 140.

Each serial channel 402 may be independently programmed as either an input channel or output channel. The hardware architecture file downloaded to the RHM 325 determines the directionality (i.e. input or output) of each virtual channel slot. In addition, the front-end configuration file downloaded to the RFE 330 determines the directionality of each programmable transceiver in a manner which is consistent with the directionality of the corresponding virtual channel slot. Once programmed, each serial channel achieves a high-speed input or output channel for communication with the UUT 150. High data transfer rates are attainable because the serial channels 402 are hardware programmed into the RHM 325 and 330 as opposed to being implement by a CPU in software.

For the sake of discussion, suppose serial channel 402A is an output channel and serial channel 402B is an input channel. Out-going data, i.e. data to be transmitted to the UUT 150 through conductor 425A, is first transferred to the virtual channel slot 405A over internal bus 320. Virtual channel slot 405A is preferably programmed to include an input buffer for temporarily storing the out-going data. Local CPU 305 or host CPU 200 may load the input buffer with out-going data The virtual channel slot 405A may then transfer the outgoing data to programmable transceiver 410A over serial bus 408A. Virtual channel slot 405A is preferably programmed to include a parallel-to-serial converter for transforming the out-going data into a serial form. Programmable transceiver 410A conditions, encodes, and/or modulates the out-going data in a manner determined by the front-end configuration file. The resultant signal is transmitted by programmable transceiver 410A to UUT 150 over conductor 425A. For example, the out-going data may be encoded as a four-level signal, i.e., a signal with four discrete amplitude levels. The front-end configuration file may then specify the line encoding scheme to be four-level coding, and provide the four voltage levels for transmitting the signal data.

An in-coming signal, i.e., a signal transmitted from the UUT 150, may be received from conductor 425B by programmable transceiver 410B. Programmable transceiver 410B decodes, demodulates, and/or operates on the received signal in a manner determined by the front-end configuration file. The programmable transceiver 410B may then supply a digital data stream to virtual channel slot 405B over serial bus 408B. Virtual channel slot 405B is preferably programmed to include a serial-to-parallel converter for converting the data stream into parallel form. Virtual channel slot 405B may store the received data in an output buffer. The output buffer may be configured as part of virtual channel slot 405B or may reside external to the virtual channel slot 405B. The output buffer may be read by local CPU 305 and/or host CPU 200 for further processing and/or storage of the received data. For example, the received data may be transferred to system memory 210, or local memory 310.

In addition, virtual channel slot 405B may perform various operations on the received data as determined by the hardware architecture file. For example, the virtual channel slot 405B may be programmed to perform pattern detection, edge detection, parity checking, etc. on the received data stream. A pattern matching circuit encoded into the virtual channel slot 405B may scan for the occurrence of a given pattern in the received data stream. Upon detection of the pattern, the pattern matching circuit asserts a pattern match signal. The pattern match signal may be used to trigger one or more other events. The pattern match circuit may be useful for detecting the start and/or end of a data frame. The search pattern may be programmed into a register or buffer of the pattern match circuit.

As an example of decode programmability, programmable transceiver 410B (and any of the programmable transceivers 410) may be programmed to decode the received signal as a multi-level signal. The front-end configuration file specifies the number of levels in the multi-level signal and the voltage value associated with each of the multiple levels.

One or more of the virtual channel slots 405 may be programmed to include a triggering circuit to be described in detail somewhat later. The triggering circuit may receive various signals of interest to the user such as a pattern match signal, an edge detection signal, an external trigger, etc. The trigger circuit may generate a trigger signal as a function of the input signals. The trigger signal may be used to initiate or terminate the transmission and/or reception of channel data. For example, the trigger signal may be supplied to virtual channel slot 405A to initiate data transfer to the UUT 150. Alternately, the trigger signal may be supplied to virtual channel slot 405B to initiate the buffering of received data.

Virtual channel slot 405A may be coupled to programmable transceiver 410A by a control bus 407A. The control bus 407A allows the virtual channel slot 405A to control various operations of the programmable transceiver 410A. Similarly, virtual channel slot 405B may be coupled to programmable transceiver 410B to control the operation of programmable transceiver 410B.

Programmable clock generator 327 is configured to generate a clock signal and supply the clock signal to the RHM 325. The frequency or period of the clock signal is programmable. The local CPU 305 and/or the host CPU 200 may load the clock frequency or period information into a register of the PCG 327. The PCG 327 generates a clock signal whose frequency is determined by the value stored in the register. One or more serial channels 402 may use the clock signal. For example, the clock signal may be used to control synchronous reception or transmission of serial data. In one embodiment of the PCG 327 may generate one or more clock signals each with a programmable clock rate.

An external clock line 420 may be provided to the reconfigurable test instrument 130. The external clock line 420 allows an external clock signal to be used in addition to or instead of the internal clock supplied by the PCG 327. For example, a first subset of the serial channels 402 may perform synchronous transfers based on the external clock, while a second subset of the serial channels 402 may perform synchronous transfers based on the internal clock. It is noted that a third subset of serial channels may perform asynchronous transfers using digital phase locked loops to synchronize with an input serial stream. These features, i.e. external synchronicity, internal synchronicity, or asynchronous transfer are programmed into the structure of each of the virtual channel slots 405 by the hardware architecture file which is downloaded to the RHM 325.

Figure 4B:
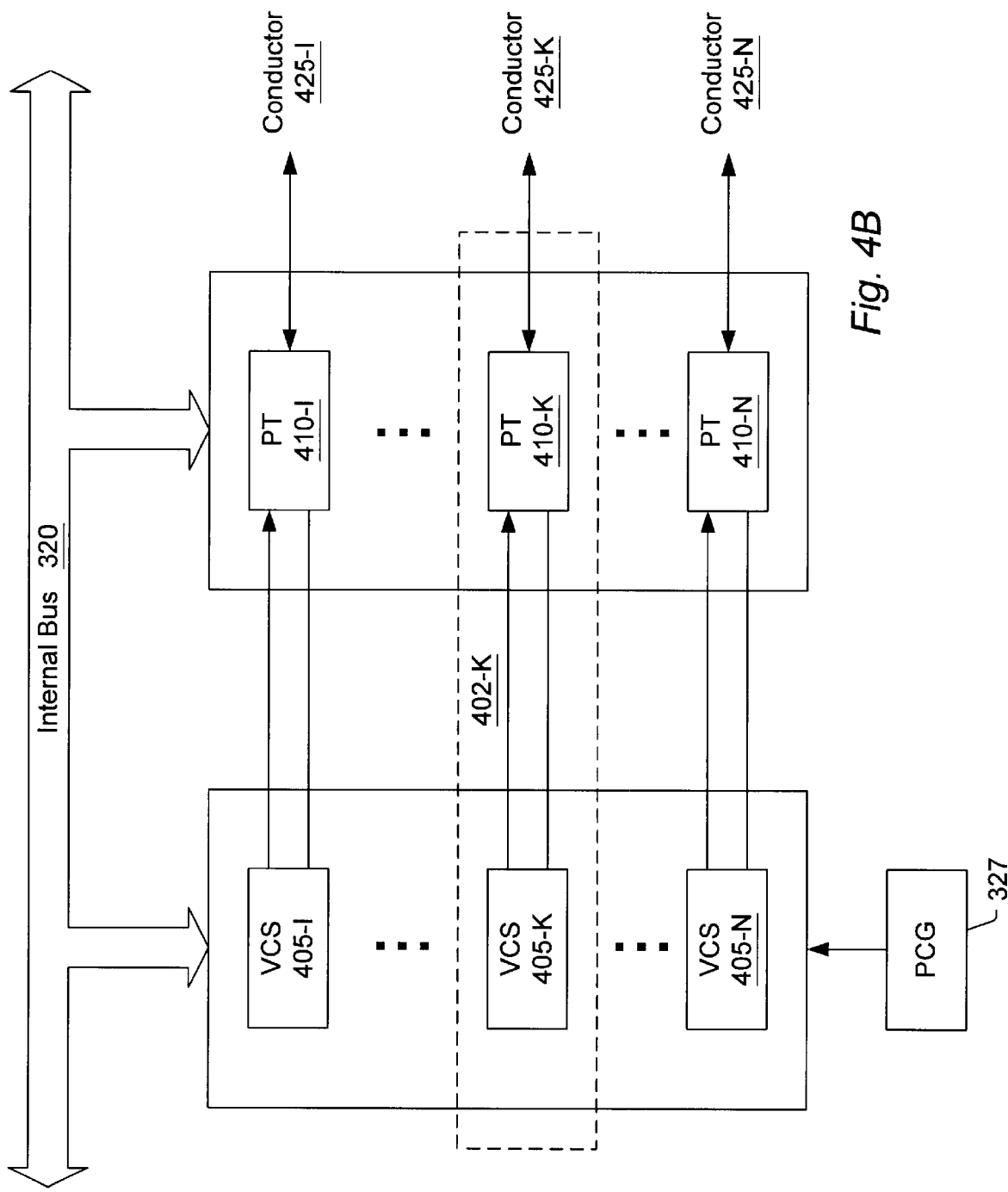
FIG. 4B presents a block diagram of a second embodiment of the reconfigurable hardware module 325 and the reconfigurable front end 330 with an arbitrary number of serial channels according to the present invention.

FIG. 4B: An Arbitrary Number of Channels

FIG. 4B presents one embodiment of reconfigurable hardware module (RHM) 325 and reconfigurable front end (RFE) 330 which together implement N serial channels. Thus, RHM 325 comprises N virtual channels slots 405, i.e. virtual channel slots 405-1 through 405-N. Also, RFE 330 comprises N programmable transceivers 410, i.e. programmable transceivers 410-1 through 410-N. The generic serial channel, i.e., serial channel 402-K, includes a virtual channel slot 405-K and a programmable transceiver 410-K, and is coupled to a conductor 425-K which forms a portion of communication medium 140. Conductors 425-1 through 425-N form communication medium 140.

FIG. 5: Host Software Architecture

FIG. 5 illustrates the preferred embodiment of the host software architecture according to the present invention. The components of the host software architecture are preferably stored in non-volatile memory 225 which includes any of a variety of storage media such as a hard drive, a CD-ROM drive, a floppy drive, a zip drive, a tape drive, etc., or any combination thereof. The host software components are loaded from the non-volatile memory 225 into system memory 210 as they are needed. The software architecture comprises software configuration utility 500, component selector 510, software driver 520, driver component library 530, embedded software library 540, hardware architecture library 550, front end configuration library 560, and software test application 565.

The software configuration utility 500 preferably comprises a graphical user interface (GUI) for configuring the reconfigurable test system 100. The software configuration utility 500 accepts user input 501 and sends graphical output 502 to the user through display 235. The software configuration utility 500 sends commands to the component selector 510 in response to choices made by the user. In response to these commands, the component selector 510 selects files from the driver component library 530, the embedded software library 540, the hardware architecture library 550, and the front-end configuration library, and registers these files with the software driver 520. In the preferred embodiment, the software configuration utility 500, the component selector 510, and the software driver 520 programs execute on host CPU 200.

The software driver 520 comprises a collection of software routines which provide a software interface for interacting with peripheral devices including the reconfigurable test instrument 130. Software programs including the software test application may call the driver routines in order to arrange data transfer to/from reconfigurable test instrument 130 and other peripheral devices as desired. The software driver 520 exchanges various control signals with the reconfigurable test instrument 130. In FIG. 5, the exchange of control signals between software driver 520 and reconfigurable test instrument 130 is represented by control stream 570. The control signals serve to direct the I/O activity of the reconfigurable test instrument 130. Also, software driver 520 exchanges data with the reconfigurable test instrument 130. Data transfer activity between the software driver 520 and reconfigurable test instrument 130 is represented by data I/O stream 575. Furthermore, software driver 520 downloads configuration information (to be described below) to the reconfigurable test instrument 130. This download activity is represented by download stream 580.

The driver component library 530 comprises a collection of software modules which perform various functions which may be of interest to a user for building a test application. One or more of these software modules may be registered with the software driver 520. After this registration, host programs including the software test application 565 may call the registered software modules. The driver component library 530 preferably includes software modules which perform functions such as protocol handling, fundamental test procedures, etc.

Software test application 565 serves to control a test procedure in part by making calls to the software driver 520, and especially to the driver software modules which have been registered in the software driver 520 in response to user configuration selections. For example, the software test application 565 may induce the transfer of data/control signals to/from UUT 150 through one or more serial channels by calling appropriate driver software modules of the software driver 520.

Figure 6A:
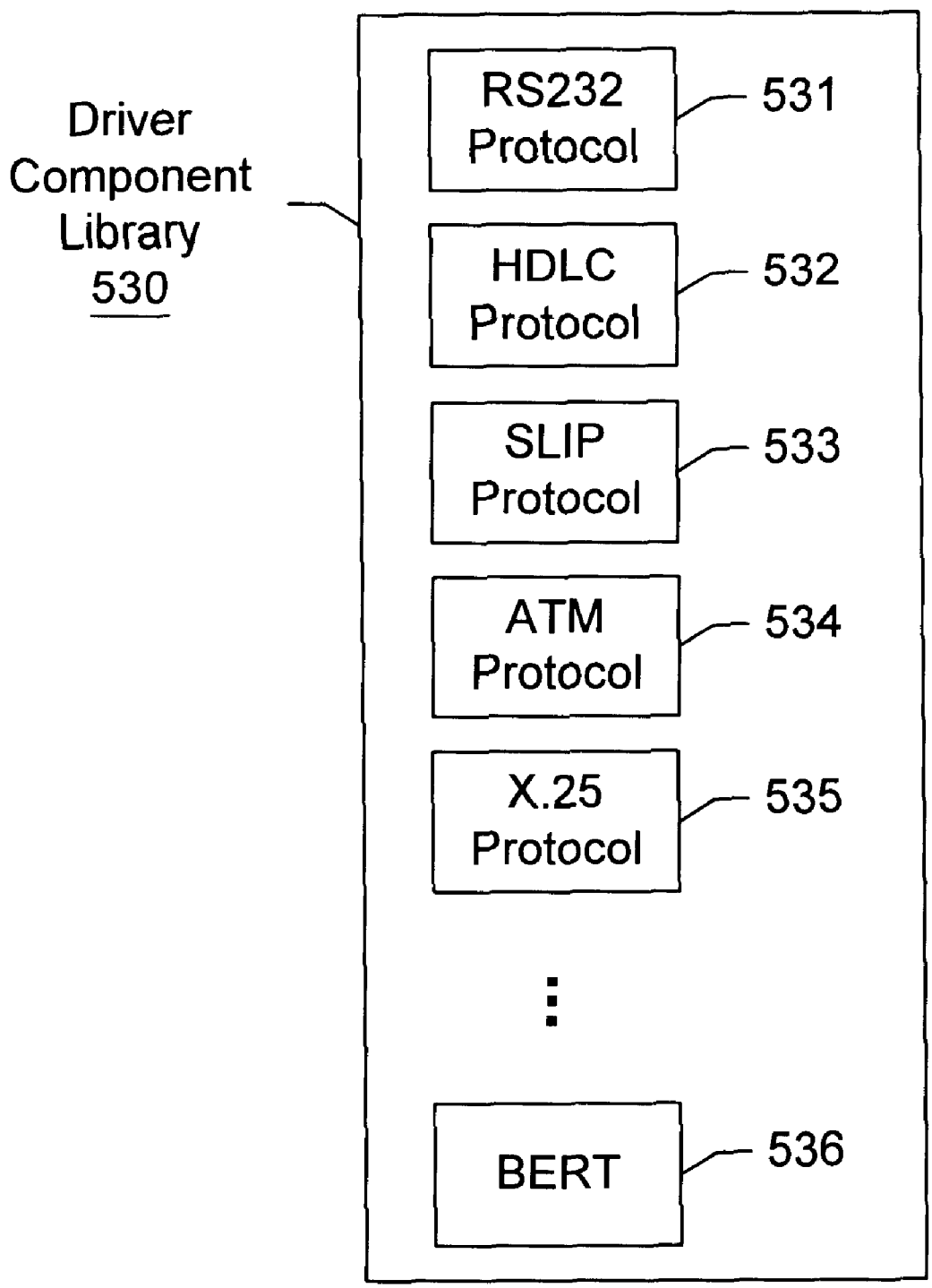
FIG. 6A illustrates the driver component library 530 according to one embodiment of the present invention.

As shown in FIG. 6A, the driver component library 530 may include modules such as the following: module 531 for implementing the RS232 protocol; module 532 for implementing the HDLC protocol; module 533 for implementing the SLIP protocol; module 534 for implementing the ATM protocol; module 535 for implementing the X.25 protocol; module 536 for implementing a bit error rate test (BERT), and so on. The driver component library may include other modules for implementing other telecommunication protocols and other test procedures. Furthermore, as new telecommunication protocols or standards are developed, new software modules may be added to the driver component library 530.

It is noted that protocol handling may be implemented (a) by driver software modules as illustrated above, (b) by programming the RHM 325 with a hardware architecture file, (c) by programming the RFE 330 with a front-end configuration file, (d) by downloading embedded software programs for execution on local CPU 305, or any combination thereof. In particular, the reconfigurable test system 100 allows a system user/developer to achieve an optimal distribution of protocol processing tasks to each of these reconfigurable targets.

The configuration utility 500 preferably provides the user with a choice of one or more telecommunication protocols to be implemented by the reconfigurable test system 100. The configuration utility also validates the compatibility of the one or more telecomnunication protocols to guide the user in selection of appropriate combinations of protocols.

The component selector 510 selects one or more user selected modules from the driver component library 530 and registers the selected modules with the software driver 520. The software driver 520 has a flexible structure which allows software modules to be inserted to provide specific kinds of test functionality.

It is noted that certain telecommunication protocols fall into a hierarchical organization. For example, the HDLC protocol is a superstructure imposed on top of RS232, and the SLIP protocol is a superstructure on top of HDLC. In the preferred embodiment, the software modules of the software component library reflect the compatibility structure of such hierarchical organizations. Thus, the RS232 module 531, HDLC module 532, and the SLIP module 533 may be simultaneously chosen by component selector 510 for incorporation into the software driver structure, and together they are capable of implementing the SLIP protocol. Block generation software can be used, such as LabVIEW or VHDL, to generate the above software modules or blocks.

Figure 6B:
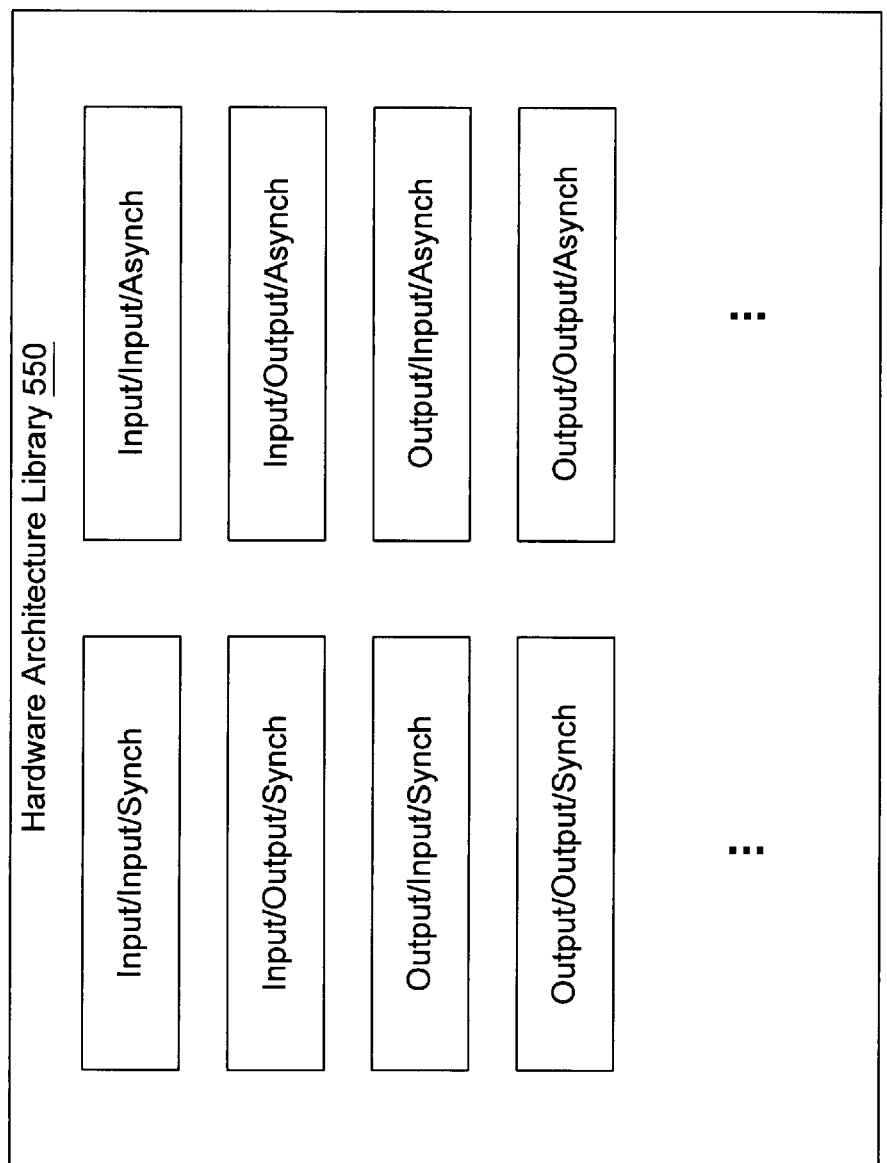
FIG. 6B illustrates the hardware architecture library 550 according to one embodiment of the present invention.

FIG. 6B: Hardware Architecture Library

FIG. 6B illustrates one embodiment of the hardware architecture library 550 which comprises a variety of hardware architecture files. Each hardware architecture file contains data which specifies a complete hardware architecture which can be downloaded to the reconfigurable hardware module (RHM) 325 subject to user selection. In the preferred embodiment of the invention, the reconfigurable hardware module 130 includes one or more programmable hardware elements such as Field Programmable Gate Arrays (FPGAs). The RHM 325 preferably includes sufficient gate capacity for programming at least two I/O channels. However, it is noted the reconfigurable hardware module 325 herein described may be naturally extended to any desired number of I/O channels. In the preferred embodiment, each hardware architecture file contains information for programming the virtual channel slots 405 of the RHM 325 with a particular I/O channel structure.

The configuration utility 500 prompts the user to specify how the virtual channel slots 405 of the RHM 325 are to be configured. For example, in the case that RHM 325 includes two virtual slots 405 as shown in FIG. 4A, the configuration utility 500 allows the user to choose the directionality, i.e. input or output, for each of the virtual channel slots 405A and 405B. In addition, the configuration utility 500 allows the user to select between synchronous transfer or asynchronous transfer. A variety of other features may be provided for user selection. The hardware architecture library 550 contains hardware architecture files that span the set of possible combinations of user choices. For example, the hardware architecture file denoted OutputlInput/Synch contains the configuration data to realize an output in virtual channel slot 405A, an input in virtual channel slot 405B, and synchronous transfer mode in both serial channels 402.

The embedded software library 540 preferably includes a rich variety of embedded software programs for performing processing and/or control tasks which may be of interest to the user. One or more of these embedded software programs may be downloaded to local memory 310 and executed by local CPU 305. For example, embedded software library 540 may include embedded software programs for handling any of a variety of protocols, for performing real-time signal processing tasks, etc. The software configuration utility 500 preferably allows the user to choose one or more of the embedded software programs for downloading to the reconfigurable test instrument 130.

The front end configuration library 560 preferably includes a collection of front end configuration files for achieving a rich variety of front end configurations. Each of these front end configuration files may be downloaded to the reconfigurable front end (RFE) 330 to realize a particular front-end operational structure. For embodiments of the RFE 330 which include one or more Field Programmable Analog Arrays (FPAAs), the front end configuration file preferably includes information for programming the FPAA (s). A front end configuration file includes information for programming the reconfigurable hardware of the RFE 330. For example, a front end configuration file preferably includes information for programming the directionality (i.e. input or output), line encoding scheme, etc. for each of the programmable transceivers 410 of the RFE 330.

Figure 7:
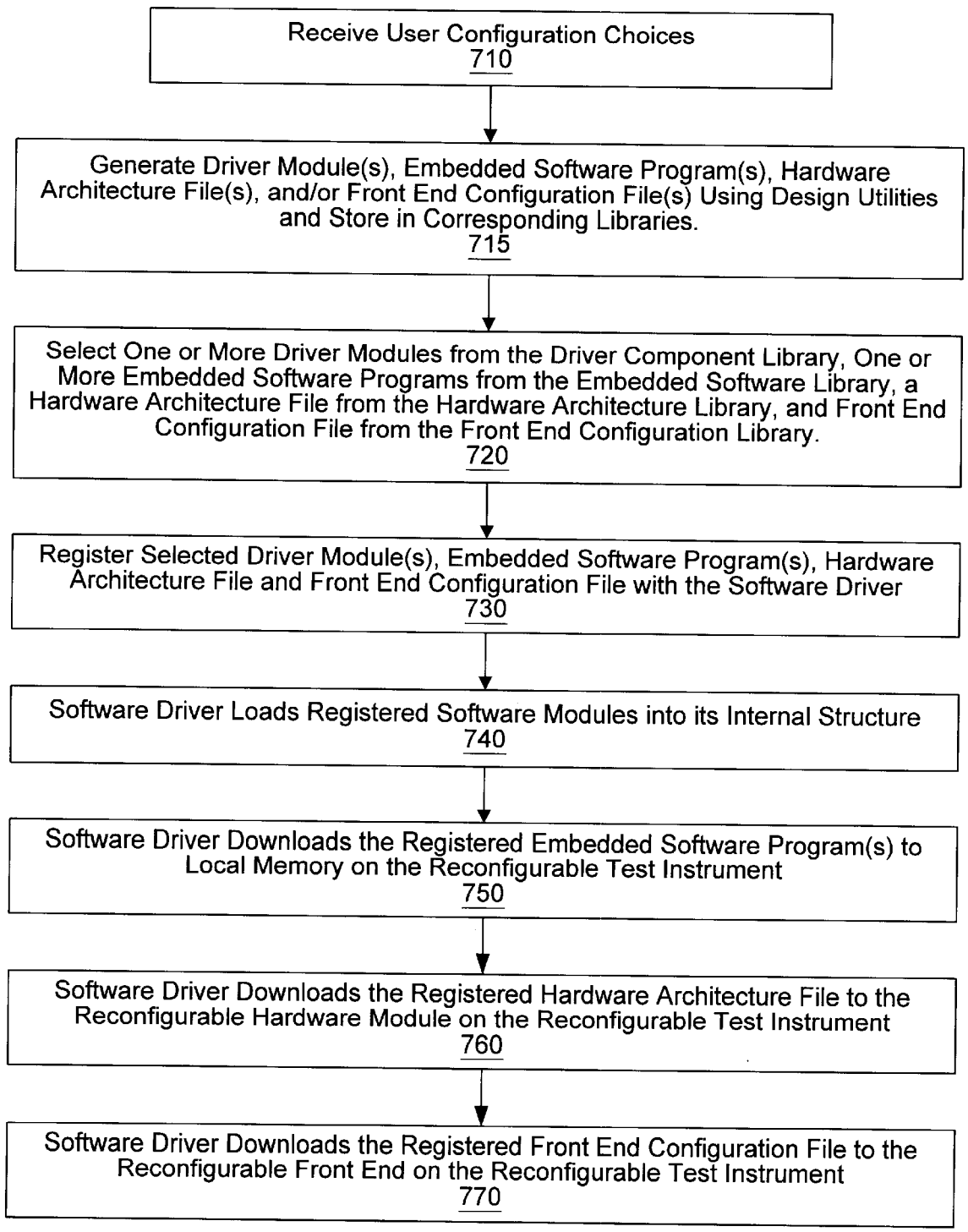
FIG. 7 illustrates the process of configuring the reconfigurable test system 100 according to the preferred embodiment of the present invention.

FIG. 7: Configuration Flowchart

FIG. 7 presents a flowchart for the configuration steps performed in the preferred embodiment of the present invention. In step 710, the configuration utility 500 prompts the user for choices of system features such as, for example, (1) a desired number of serial channels 402 to be programmed into the RTI 130 for signal exchange with the UUT 150;

(2) a desired directionality (input/output) for each of the serial channels 402;

(3) telecommunication protocols to be used for each of the serial channels 402;

(3) a line encoding scheme to be used for driving each output channel, and/or voltage levels for driving multi-level output signals;

(4) a line encoding scheme to be expected for receiving signals on each input channel, and/or voltage levels to be expected for receiving signals on each input channel;

(5) an option for using synchronous data transfer versus asynchronous data transfer for each serial channel;

(6) for synchronous channel, whether an internally generated clock signal is to be used or an externally provided clock;

(7) test type of test scenario or test procedure which is to be applied to the UUT 150.

The configuration utility 500 preferably includes a graphical user interface to make the user interaction more natural and efficient. In one embodiment of the configuration utility 500, the configuration utility 500 provides indication of compatibility or incompatibility of the user's collection of choices. The user may thereby be able to make more informed choices of hardware and software configuration.

In response to these choices, the component selector 510 selects one or more driver modules from the driver component library 530, one or more embedded software programs from the embedded software library 540, a hardware architecture file from the hardware architecture library 550, and a front end configuration file from the front end configuration library 560 as shown in step 720.

In addition to selecting components, i.e. driver modules, embedded software programs, hardware architecture files, and front end configuration files, from the respective libraries, the user has the option of creating and/or modifying these components using any or all of the design utilities described above as indicated by step 715. Thus, the components selected in step 720 may be those created and/or modified by the user in step 715.

The component selector 510 registers the selected one or more driver modules, one or more embedded software programs, hardware architecture file and front end configuration file with the software driver 520 as shown in step 730.

In step 740 the software driver 520 loads the registered software modules into its internal structure. In step 750 the software driver 520 downloads the registered embedded software program(s) to local memory 310 on the reconfigurable test instrument 130. In step 760 the software driver 520 downloads the registered hardware architecture file to the reconfigurable hardware module 325 in the reconfigurable test instrument 130. In step 770 the software driver downloads the registered front end configuration file to the reconfigurable front end 330 on the reconfigurable test instrument 130. It is noted that steps 740, 750, 760 and 770 may be performed in any order.

The entire process from user selection to system configuration is preferably performed in real-time and can be repeated whenever the user deems necessary. For example, if the user has finished testing a first device or first plurality of devices of a common type and desires to test a different type of device as the UUT 150, the user reconfigures the reconfigurable test system 100 by entering new choices in the configuration utility 500.

In addition, the features of the configuration utilities are available programmatically, meaning that during a test operation the user could select new functionality using the GUI, or the program is created such that it automatically changes the configuration in response to some event.

Quite often, testing a new device will imply the use of a different telecommunication protocols and/or channel structure for signal exchange over communication medium 140. Thus, when reconfiguring the reconfigurable test system 100, the user may specify choices of one or more new telecommunication protocols, a new test scenario, and/or new hardware architecture using the configuration utility 500. In addition, when creating the program in the reconfigurable test system 100, the user may create the program such that choices of one or more new telecommunication protocols, a new test scenario, and/or new hardware architecture are automatically selected and implemented by the program in response to one or more events that occur during program execution.

In the preferred embodiment of the invention, most of the operations connected with handling telecommunication protocols are implemented in software using the driver modules and the embedded software modules. As described above, one or more driver modules from the driver component library 530 may be incorporated into the software driver 520, and one or more embedded software modules may be downloaded to the local memory 310 for execution by the local CPU 305.

As described above, the input/output configuration of virtual channel slots 405 are determined by the hardware architecture file downloaded to the RHM 325. For example, if the hardware architecture file denoted by Input/Output::Asynch in FIG. 6B is downloaded to the RHM 325, virtual channel slot 405A is thereby configured as an input channel, virtual channel slot 405B is thereby configured as an output channel, and both channels are configured for asynchronous operation.

Hardware architecture files which specify asynchronous operation may program a digital phase locked loop into one or more of the virtual channel slots 405. Alternatively, digital phase locked loops may be included as part of the reconfigurable hardware of RFE 330.

In one embodiment of the present invention, the user creates a graphical program using a graphical programming environment, such as LabVIEW from National Instruments Corporation. The graphical programming environment preferably executes on the host CPU 200. A portion of the graphical program is compiled into a hardware architecture file for downloading to the reconfigurable hardware module 325 which contains one or more FPGAs. In addition, a portion of the graphical program is compiled into a front end configuration file for downloading to the reconfigurable front end 330. Another portion of the graphical program may be compiled into an embedded software program for downloading to local memory 305 and execution by local CPU 310. Yet another portion of the graphical program may be compiled into software modules for registry/incorporation into the software driver 520. Also, portions of the graphical program may be compiled into instruction code for execution on host CPU 200. For example, the software test program described above may be generated from portions of the graphical program which are compiled into instruction code for the host CPU 200. In this embodiment, the local memory 310 preferably stores a kernel providing basic OS services, as well as a graphical programming system run-time engine for real-time execution of compiled graphical programs. The local memory 310 is also operable to receive and store a portion or all of a compiled graphical program for execution in the reconfigurable test instrument 130. The embedded CPU 305 executes code and data from the embedded memory 310 to implement at least a portion of a virtual instrumentation or industrial automation function, such as a telecommunication test function. The user may specify which portions of the graphical program are to be targeted for the respective destinations: reconfigurable hardware module 325, reconfigurable front end 330, embedded software for execution by local CPU 200, host driver modules for registry with the software driver 520, or host program code. Alternatively, an optimization utility may be invoked to automatically optimize the distribution of portions of the graphical program to the various target destinations. Thus, by creating, compiling, and downloading such a graphical program, the user may generate a desired configuration for the reconfigurable test system 100.

Thus, in one embodiment, after one or more graphical programs have been created, at least a portion of the one or more of the graphical programs are compiled for execution on the local CPU 305 and execute locally on the reconfigurable test instrument 130 via the local CPU 305 and local memory 310, and at least a portion of the one or more graphical programs is translated or converted into a hardware executable format and downloaded to reconfigurable hardware module 325 which includes one or more FPGAs.

For more information on these embodiments including a reconfigurable or programmable logic device, such as an FPGA, and/or a local or embedded CPU, please see U.S. patent application Ser. No. 08/912,427 filed Aug. 18, 1997, entitled "System and Method for Converting Graphical Programs into Hardware Implementations" whose inventors are Jeffrey L. Kodosky, Hugo Andrade, Brian Keith Odom and Cary Paul Butler, and U.S. patent application Ser. No. 08/912,445 filed Aug. 18, 1997, entitled "Embedded Graphical Programming System" whose inventors are Jeffrey L. Kodosky, Darshan Shah, Samson DeKey and Steve Rogers, referenced above.

Figure 8:
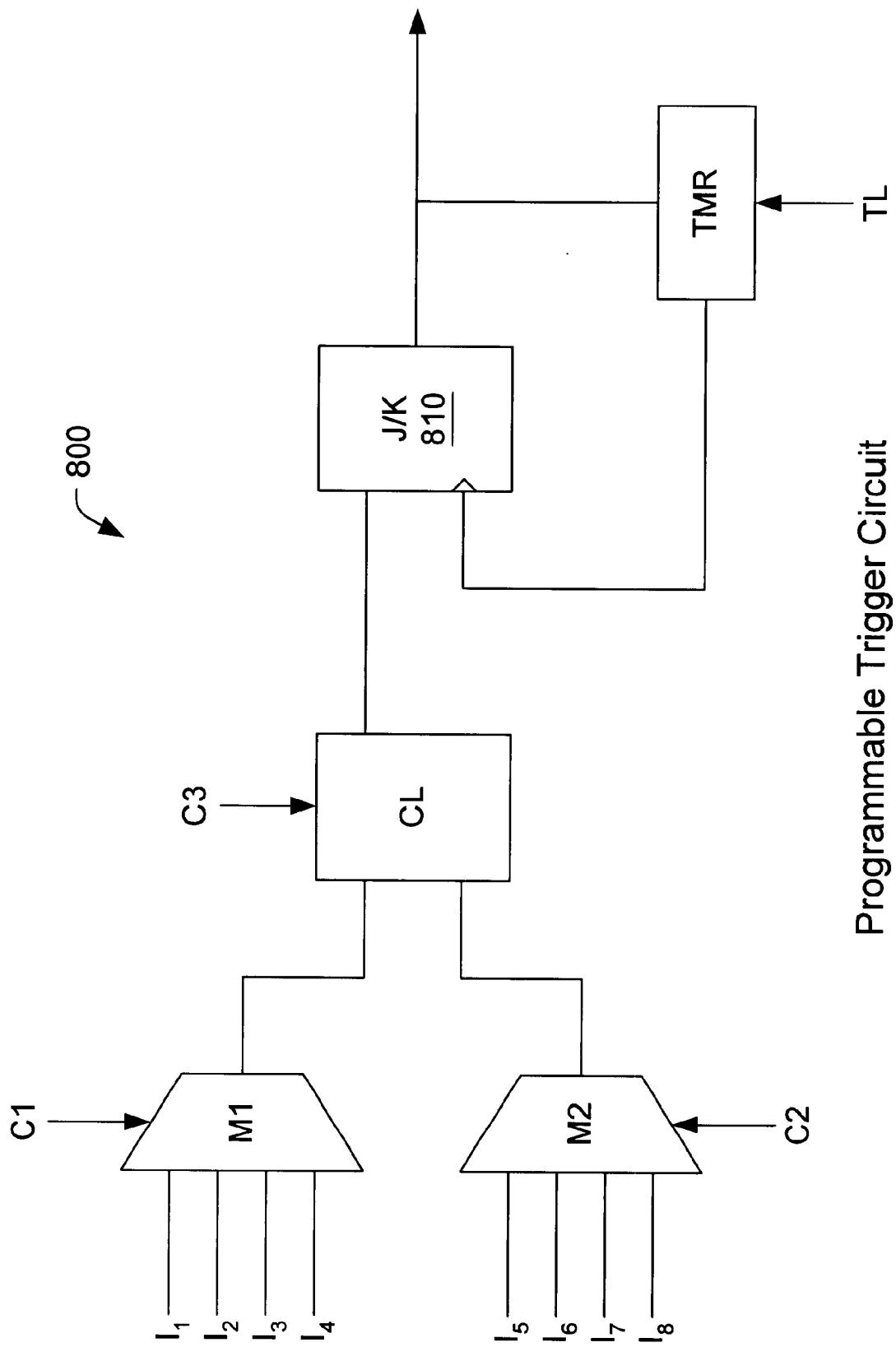
FIG. 8 presents a block diagram for a programmable trigger circuit 800 according to the one embodiment of the present invention.

FIG. 8: Programmable Triggering Circuitry

FIG. 8 illustrates one embodiment of a programmable triggering circuit 800 according to the present invention. In the preferred embodiment of the invention, one or more of the hardware architecture files in the hardware architecture library may include programming information which defines programmable triggering circuit 800. Alternatively, in the hardware design utility discussed above, the user may be able to choose programmable triggering circuit 800 as one of the graphical icons for building a circuit diagram. When downloaded to the RHM 325, such a hardware architecture file posits the RHM 325 with the ability to various triggering functions.

The trigger circuit 800 includes a first multiplexer M1 and a second multiplexer M2. Each multiplexer is provided with a plurality of inputs denoted I1, I2, I3, and I4. The multiplexers M1 and M2 receive control or select inputs C1 and C2 respectively. The value asserted on control input C1 determines which of inputs I1 through I4 is coupled to the output of multiplexer M1. Similarly, control or select input C2 determines which of the inputs I5 through I8 is coupled to the output of multiplexer M2. The outputs of the multiplexers M1 and M2 are supplied as inputs to combinational logic CL. Combinational Logic CL receives a control input C3 which determines a combinational logic function which operates on the outputs of the multiplexers. In one embodiment of the invention, the combinational logic CL is configured to perform an logical AND operation, or a logical OR operation depending on a value asserted on control input C3. In a second embodiment, the combinational logic CL is configured to perform additional logic functions which include any or all of the logical functions in two binary variables (A XOR B, A OR –B, . . . ).

The output of combinational logic CL is supplied as an input to J/K flip-flop 810. The output of J/K flip-flop 810 represents a dual-event triggering signal (i.e. a triggering signal which is sensitive to two input conditions) and comprises the output of the trigger circuit 800. This output signal may be used to trigger the acquisition of data for an input channel and/or the transmission of data from a serial output channel. Thus, the signal at the output of the J/K flip-flop is referred to as the trigger signal. The trigger signal is coupled to a timer TMR. An output from the timer TMR is coupled to the reset input of the J/K flip-flop. The timer TMR is loaded with an initial count value through timer load line TL. In response to the rising edge of the trigger signal, the timer TMR starts to decrement its internal count value. When the count value reaches zero, the timer TMR asserts an output signal which resets the J/K flip-flop 810. Thus, when the trigger signal is asserted, it remains in the asserted state for a period of time determined by the initial count value.

It is noted that the signals I1 through I4 and I5 through I8 are not necessarily distinct sets of signals. The signals I1 through I8 comprise various signals which may be of interest to a user in building a triggering signal. Signals I1 through I8 may represent signals such as a pattern match signal, an edge detection signal, an external trigger signal, etc. For example, the signal I1 may be a rising (or falling) edge detection signal provided by an edge detection circuit. The signal I2 may be an external trigger signal (not shown in FIG. 7). The signal I3 may be the output of a pattern detection circuit. In one embodiment, the pattern detection circuit is configured to detect a serial data pattern occurring on a serial input channel (or output channel). The pattern detection circuit may be loaded with a search pattern which is to be compared with the input data stream from an input channel. When the given pattern is detected, the pattern detection circuit asserts a signal at its output which indicates the detected pattern.

Thus, the trigger circuit 800 of the present invention enables the reconfigurable test instrument 130 to trigger on any desired combination of events represented by I1 through I8. The control inputs C1, C2, and C3, and timer load line TL may be determined by control information asserted by the software driver 520 on normal control flow 570 and data I/O path 575 as well as by the hardware architecture file which is downloaded to the RHM 325.

Conclusion

Although the system and method of the present invention has been described in connection with the specific embodiments, it is not intended to be limited to the specific forms set forth herein, but on the contrary, it is intended to cover such alternatives, modifications, and equivalents, as can be reasonably included within the spirit and scope of the invention as defined by the appended claims.

We claim:

1. A reconfigurable test system comprising:
   a computer system which includes a host CPU and host memory, wherein the host memory stores a hardware architecture library, a driver component library, a configuration utility, and a software driver, wherein the hardware architecture library comprises a plurality of hardware architecture files, wherein the driver component library comprises a plurality of software driver modules;
   an instrument coupled to the computer system, wherein the instrument includes a reconfigurable hardware module, wherein the instrument also includes a reconfigurable front end, wherein the reconfigurable front end includes at least one programmable transceiver;
   wherein the host CPU is configured to execute the configuration utility, wherein the configuration utility receives user input to configure the reconfigurable test system, wherein said user input determines selection of a first hardware architecture file from the hardware architecture library, wherein said user input also determines selection of one or more software driver modules to be incorporated into said software driver;
   wherein, in response to said user input, the host CPU is operable to download the first hardware architecture file to the reconfigurable hardware module, and wherein the host CPU is further operable to install the selected one or more software driver modules into the software driver to configure the test system;
   wherein, in response to said user input, the host CPU is operable to download a front end configuration to the reconfigurable front end, wherein the front end configuration is operable to configure the at least one programmable transceiver.

2. The reconfigurable test system of claim 1, wherein the instrument is operable to be coupled to a unit test (UUT) in order to test the UUT;
   wherein different types of UUTs may be coupled to the instrument;
   wherein the reconfigurable test system is reconfigurable to test said different types of UUTs.

3. The reconfigurable test system of claim 1, wherein each programmable transceiver is coupled to a unit under test (UUT), and wherein each programmable transceiver is further coupled to the reconfigurable hardware module.

4. The reconfigurable test system of claim 3, wherein said front end configuration determines a directionality and line encoding scheme for each of said programmable transceivers.

5. The reconfigurable test system of claim 1, wherein the instrument also includes a local CPU and a local memory;
   wherein said user input determines selection of one or more embedded software programs from an embedded software library stored in the host memory;
   wherein, in response to said user input, the host CPU is operable to compile said one or more embedded software programs and download the compiled one or more embedded software programs to the local memory for execution by the local CPU.

6. The reconfigurable test system of claim 1, further comprising a graphical programming system for creating a graphical program;
   wherein said host CPU is operable (a) to compile a first portion of said graphical program to generate said first hardware architecture file, and (b) to compile a second portion of said graphical program to generate said one or more driver software modules.

7. The reconfigurable test system of claim 1, further comprising a graphical programming system for creating a graphical program, wherein said host CPU is operable to select said hardware architecture file based on a portion of said graphical program.

8. The reconfigurable test system of claim 1,
   wherein different types of UUTs having various testing requirements may be coupled to the instrument;
   wherein the reconfigurable test system is reconfigurable to test said different types of UUTs having said various testing requirements.

9. The reconfigurable test system of claim 1, wherein each of said one or more software driver modules implements one of said different testing requirements.

10. The reconfigurable test system of claim 1,
    wherein different types of UUTs having various communication protocols may be coupled to the instrument;
    wherein the reconfigurable test system is reconfigurable to test said different types of UUTs having said various communication protocols.

11. The reconfigurable test system of claim 10, wherein each of said one or more software driver modules implements a different communication protocol.

12. The reconfigurable test system of claim 10, wherein the configuration utility provides the user with a choice of said various telecommunication protocols;
    wherein the choice of said telecommunication protocols determines said selection of said one or more software driver modules to be incorporated into said software driver.

13. The reconfigurable test system of claim 1, wherein the instrument is operable to be coupled to a unit under test (UUT) to test the UUT, wherein the UUT comprises a telecommunication device;
    wherein different types of telecommunication devices may be coupled to the instrument;
    wherein the reconfigurable test system is reconfigurable to test said different types of telecommunication devices.

14. The reconfigurable test system of claim 13,
    wherein different types of telecommunication devices having various telecommunication protocols may be coupled to the instrument;
    wherein the reconfigurable test system is reconfigurable to test said different types of telecommunication devices having said various telecommunication protocols.

15. The reconfigurable test system of claim 1, wherein each of said one or more software driver modules implements a different telecommunication protocol.

16. The reconfigurable test system of claim 15, wherein the configuration utility provides the user with a choice of one or more telecommunication protocols;
    wherein the choice of said one or more telecommunication protocols determines said selection of said one or more software driver modules to be incorporated into said software driver.

17. The reconfigurable test system of claim 16, wherein the configuration utility validates compatibility of said one or more telecommunication protocols.

18. The reconfigurable test system of claim 1, wherein each of said plurality of hardware architecture files is operable to configure the instrument with a corresponding hardware architecture.

19. The reconfigurable system of claim 18, wherein said reconfigurable hardware module includes one or more Field Programmable Gate Arrays (FPGAs).

20. The reconfigurable test system of claim 18, wherein each of said plurality of hardware architecture files is operable to configure the instrument with a corresponding I/O channel structure.

21. The reconfigurable test system of claim 18, wherein the configuration utility provides the user with choices of hardware features, wherein said choices of hardware features determine said selection of said hardware architecture file from the hardware architecture library.

22. The reconfigurable test system of claim 21, wherein one of said choice of hardware features comprises a first choice of whether synchronous or asynchronous communication is to be implemented in said reconfigurable hardware module, wherein said first choice determines selection of said first hardware architecture file from the hardware architecture library.

23. The reconfigurable test system of claim 1, wherein the configuration utility is executable to present a graphical user interface (GUI) which displays a plurality of user selectable options.

24. The reconfigurable test system of claim 1, wherein the reconfigurable hardware module includes at least two virtual channel slots, wherein each of said at least two virtual channel slots is configured as part of a serial input channel or serial output channel by said downloaded first hardware architecture file.

25. A method for configuring a reconfigurable test system, wherein the reconfigurable test system includes a host computer and an instrument coupled to the host computer, wherein the instrument is operable to be coupled to a unit under test (UUT), wherein the instrument includes a reconfigurable hardware module, the method comprising:

receiving configuration information from a user;
selecting one or more driver software modules from a software component library in response to said configuration information, wherein said software component library includes protocol driver modules which encode a plurality of telecommunication protocols, wherein said configuration information indicates a selection of a first telecommunication protocol, wherein said selecting one or more driver software modules includes selecting one of said protocol driver modules which corresponds to said first telecommunication protocol;
selecting a hardware architecture file from a hardware architecture library in response to said configuration information;
registering the selected one or more driver software modules into the software driver; and
downloading the selected hardware architecture file to the reconfigurable hardware module;
wherein said registering the selected one or more driver software modules and said downloading the selected hardware architecture file operate to configure the test system.

26. The method of claim 25, further comprising:
coupling a UUT to the instrument, wherein the UUT comprises a telecommunication device;
wherein different types of telecommunication devices may be coupled to the instrument;
wherein the reconfigurable test system is reconfigurable to test said different types of telecommunication devices.

27. The method of claim 25, wherein said configuration information comprises user selections of functional features for said reconfigurable test system, wherein said method further comprises validating compatibility of said user selections.

28. The method of claim 25, further comprising executing test software on the host computer to test the UUT after said registering the selected one or more driver software modules and after said downloading the selected hardware architecture file, wherein said test software performs at least one call to one of said registered driver software modules.

29. The method of claim 25, further comprising:
coupling a new UUT to the instrument;
receiving new configuration information from said user to configure the telecommunication test system for the new UUT;
selecting new one or more driver software modules from the software component library in response to said new configuration information;
selecting a new hardware architecture file from the hardware architecture library in response to said new configuration information;
registering the selected new one or more driver software modules into the software driver; and
downloading the selected new hardware architecture file to the reconfigurable hardware module;
wherein said registering of the selected new one or more driver software modules and said downloading the selected new hardware architecture file operate to configure the reconfigurable test system for the new UUT.

30. The method of claim 25, wherein said receiving said configuration information includes:
displaying a set of available telecommunication protocols;
receiving user input to select one of said available telecommunication protocols.

31. The method of claim 25,
wherein said receiving said configuration information comprises receiving information indicating a specified hardware structure;
wherein the hardware architecture file is selected in response to said specified hardware structure;
wherein said downloading the selected hardware architecture file operates to configure the reconfigurable hardware module with said specified hardware structure.

32. The method of claim 31, wherein said hardware architecture library includes a plurality of hardware architecture files, wherein each of said hardware architecture files is operable to configure the reconfigurable hardware module with a corresponding I/O channel structure.

33. The method of claim 31, wherein said hardware architecture library includes at least one hardware architecture file which is operable to configure the reconfigurable hardware module for synchronous transfer, wherein said hardware architecture library includes at least one hardware architecture file which is operable to configure the reconfigurable hardware module for asynchronous transfer.

34. The method of claim 25, further comprising:
receiving a program;
compiling a first portion of said program to generate said hardware architecture file.

35. The method of claim 34, further comprising:
compiling a second portion of said program to generate said one or more driver software modules.

36. The method of claim 34, wherein said program is a graphical program composed in a graphical programming language.

37. The method of claim 34, further comprising:

compiling a third portion of said program into one or more embedded software programs;

downloading said one or more embedded software programs to local memory on said instrument;

executing said one or more embedded software programs on an embedded CPU residing on said instrument.

38. The method of claim 37, wherein said instrument includes a reconfigurable front end, the method further comprising:

compiling a fourth portion of said program into a front end configuration file;

downloading the front end configuration file to the reconfigurable front end.

39. The method of claim 25, wherein said instrument includes a reconfigurable front end, the method further comprising:

selecting a front end configuration file from a front end configuration library, wherein said front end configuration file corresponds to at least a portion of said configuration information received from the user;

downloading the front end configuration file to the reconfigurable front end.

* * * * *

UNITED STATES PATENT AND TRADEMARK OFFICE
Certificate

Patent No. 6,311,149                                                Patented: October 20, 2001

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Arthur Ryan, Round Rock, TX; Hugo Andrade, Austin, TX; and Brian Keith Odom, Georgetown, TX.

Signed and Sealed this Twenty-Ninth Day of January 2002.

KEVIN TESKA, *SPE*
Art Unit 2122/2123